(12) United States Patent
Abe et al.

(10) Patent No.: US 9,966,962 B2
(45) Date of Patent: May 8, 2018

(54) OSCILLATION SIGNAL GENERATION CIRCUIT

(71) Applicant: Panasonic Corporation, Osaka (JP)

(72) Inventors: Takayuki Abe, Tokyo (JP); Junji Sato, Tokyo (JP)

(73) Assignee: PANASONIC CORPORATION, Osaka (JP)

(*) Notice: Subject to any disclaimer, the term of this patent is extended or adjusted under 35 U.S.C. 154(b) by 103 days.

(21) Appl. No.: 15/044,024

(22) Filed: Feb. 15, 2016

(65) Prior Publication Data
US 2016/0285465 A1    Sep. 29, 2016

(30) Foreign Application Priority Data

Mar. 24, 2015 (JP) .................................. 2015-060473

(51) Int. Cl.
| | |
|---|---|
| H03L 7/00 | (2006.01) |
| H03L 7/099 | (2006.01) |
| H03B 5/12 | (2006.01) |
| H03K 3/027 | (2006.01) |
| H03B 5/24 | (2006.01) |
| H03K 5/003 | (2006.01) |

(52) U.S. Cl.
CPC ............. *H03L 7/00* (2013.01); *H03B 5/1209* (2013.01); *H03B 5/1212* (2013.01); *H03B 5/1228* (2013.01); *H03B 5/1278* (2013.01); *H03B 5/24* (2013.01); *H03K 3/027* (2013.01); *H03K 5/003* (2013.01); *H03L 7/099* (2013.01); *H03B 2200/0088* (2013.01)

(58) Field of Classification Search
CPC ........... H03L 7/099; H03L 7/00; H03K 3/027; H03K 5/003; H03B 5/1209; H03B 2200/0088; H03B 5/1278; H03B 5/1212
USPC ........................ 331/1 A, 16, 34, 185, 176, 17
See application file for complete search history.

(56) References Cited

U.S. PATENT DOCUMENTS

2003/0025566 A1    2/2003 Rogers

OTHER PUBLICATIONS

Jia-Yi Chen et al., "A Fully Integrated Auto-Calibrated Super-Regenerative Receiver in 0.13-μm CMOS" IEEE Journal of Solid-State Circuits, vol. 42, No. 9, Sep. 2007.

(Continued)

*Primary Examiner* — Arnold Kinkead
(74) *Attorney, Agent, or Firm* — Greenblum & Bernstein, P.L.C.

(57) ABSTRACT

An oscillation signal generation circuit includes an oscillator and a calibration circuit. The oscillator includes a reference signal source circuit that has a reference signal source outputting a reference signal and converts the output reference signal into a control voltage, a filter that includes a variable resistance and a capacitance and removes noise in the control voltage, a transistor that converts the control voltage which has passed through the filter into a control current and outputs the control current, a core circuit that is driven by the control current and generates an output signal, and an output terminal that outputs the generated output signal. The calibration circuit is connected to the output terminal of the oscillator, detects whether or not the generated output signal is oscillating, and adjusts the current value of the control current by controlling the resistance value of the variable resistance in accordance with the detection result.

16 Claims, 11 Drawing Sheets

(56) References Cited

OTHER PUBLICATIONS

European Search Report, dated Aug. 30, 2016, for the related European Patent Application No. 16154681.7.
Communication pursuant to Article 94(3) EPC, dated Sep. 8, 2016, for the related European Patent Application No. 16154681.7.

OSCILLATION SIGNAL GENERATION CIRCUIT

BACKGROUND

1. Technical Field

The present disclosure relates to an oscillation signal generation circuit that operates in a high frequency band exceeding 100 GHz.

2. Description of the Related Art

In recent years, with an increase in the use of the wireless technology typified by communication and radar, a frequency has rapidly become scarce. For this reason, a frequency band exceeding 100 GHz which is a frequency higher than a millimeter waveband is expected to be utilized. Thus, it is anticipated that a wireless integrated circuit (IC) that operates in a frequency band exceeding 100 GHz will be widely used.

In general, the wireless IC is often produced by a production method such as a complementary metal-oxide semiconductor (CMOS) process by using a semiconductor as a material. However, the performance of the CMOS process at high frequencies is lower than the performance of other production methods, which makes it difficult to achieve power gain at high frequencies.

Theoretically, the use of the fine CMOS process makes it possible to produce a wireless IC that operates in a frequency band exceeding 100 GHz, but there is almost no design margin. Furthermore, accuracy variations occur between transistors for a frequency band exceeding 100 GHz, the transistors formed by the CMOS process. This makes it necessary for the wireless IC to perform calibration. There is a high possibility that, in particular, a voltage controlled oscillator (VCO) which is one of the component elements of the wireless IC does not meet an oscillation condition due to the accuracy variations between the transistors. Therefore, a calibration technique for the VCO is important in developing a wireless IC that operates in a frequency band exceeding 100 GHz.

For example, in IEEE JOURNAL OF SOLID-STATE CIRCUITS, VOL. 42, NO. 9, SEPTEMBER 2007, a configuration having a VCO and a calibration circuit that controls the oscillation condition of the VCO is disclosed. The calibration circuit disclosed in IEEE JOURNAL OF SOLID-STATE CIRCUITS, VOL. 42, NO. 9, SEPTEMBER 2007 detects a current value which is the oscillation condition by controlling a current value flowing through the VCO in accordance with an oscillation signal of the VCO.

SUMMARY

However, in the above-described existing technique of IEEE JOURNAL OF SOLID-STATE CIRCUITS, VOL. 42, NO. 9, SEPTEMBER 2007, noise contained in the current flowing through the VCO becomes phase noise in the oscillation signal. For example, it is possible to reduce the noise contained in the current by inserting an RC filter formed of a resistance and a capacitance into the VCO; however, in that case, a leakage current flowing through the resistance causes a voltage drop. That is, in the configuration in which the RC filter is inserted into the VCO, the range of calibration which controls the oscillation condition of the VCO is narrowed due to the voltage drop.

One non-limiting and exemplary embodiment provides an oscillation signal generation circuit that can expand the range of calibration which controls the oscillation condition of an oscillator while reducing phase noise in the oscillator.

In one general aspect, the techniques disclosed here feature an oscillation signal generation circuit including an oscillator and a calibration circuit. The oscillator includes a reference signal source circuit that has a reference signal source outputting a reference signal and converts the output reference signal into a control voltage, a first filter that includes a variable resistance and a capacitance and removes noise in the control voltage, a first transistor that converts the control voltage output from the first filter into a control current and outputs the control current, a core circuit that is driven by the control current and generates an output signal, and an output terminal that outputs the generated output signal. The calibration circuit is connected to the output terminal of the oscillator, detects whether or not the generated output signal is oscillating, and adjusts the current value of the control current by controlling the resistance value of the variable resistance in accordance with the detection result. These general and specific aspects may be implemented using a device, a system, a method, and a computer program, and any combination of devices, systems, methods, and computer programs.

With the present disclosure, it is possible to expand the range of calibration which controls the oscillation condition of an oscillator while reducing phase noise in the oscillator.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Underlying Knowledge Forming Basis of the Present Disclosure)

First, the underlying knowledge forming the basis of the present disclosure will be described. The present disclosure relates to an oscillation signal generation circuit that operates in a high frequency band exceeding 100 GHz.

Figure 1A:
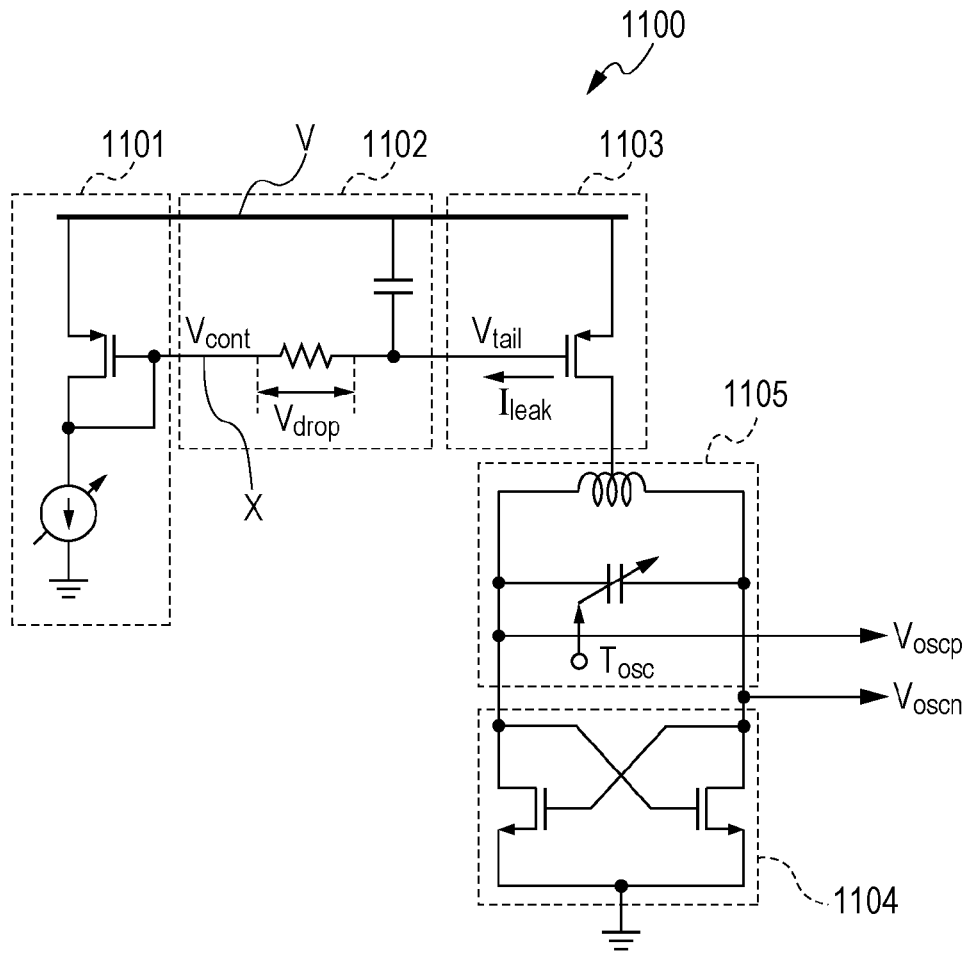
FIG. 1A is a configuration diagram of a common voltage control oscillation circuit.

FIG. 1A is a configuration diagram of a common voltage control oscillation circuit 1100. The voltage control oscillation circuit (hereinafter abbreviated as VCO) 1100 includes a reference current source circuit 1101, an RC low-pass filter 1102, a tail transistor 1103, a cross-coupled transistor 1104, and an LC tank 1105. The cross-coupled transistor 1104 and the LC tank 1105 are each a core circuit of the VCO 1100.

The reference current source circuit 1101 has a current source that outputs a reference current for generating a control voltage $V_{cont}$ for a current $I_{tail}$ which flows through the core circuit of the VCO 1100. Incidentally, the reference current source circuit 1101 may be replaced with a reference voltage source circuit having a voltage source.

The control voltage $V_{cont}$ which is generated by the reference current source circuit 1101 secondarily contains noise caused in the reference current source circuit 1101. The noise contained in the control voltage $V_{cont}$ becomes phase noise in an output signal which is output from the core circuit of the VCO 1100.

The RC low-pass filter 1102 is formed of a resistance and a capacitance and removes noise in a reference signal which is input from the reference current source circuit 1101 in order to suppress the phase noise in the output signal which is output from the core circuit of the VCO 1100. The cutoff frequency fc of the RC low-pass filter 1102 is determined by the resistance value R of the resistance and the capacitance value $C_1$ of the capacitance.

Figure 1B:
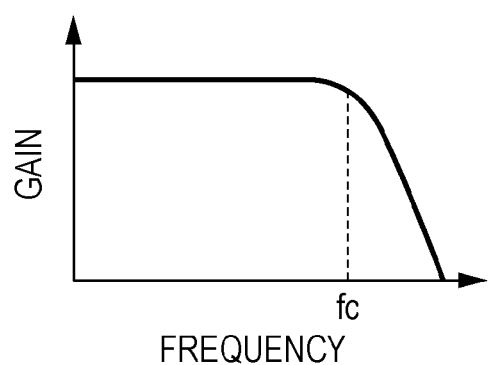
FIG. 1B is a diagram depicting the frequency characteristics of an RC low-pass filter.

FIG. 1B is a diagram depicting the frequency characteristics of the RC low-pass filter 1102. The horizontal axis of FIG. 1B represents a frequency and the vertical axis represents a gain. As depicted in FIG. 1B, the RC low-pass filter 1102 allows a frequency component of a signal which is input thereto, the frequency component which is lower than or equal to the cutoff frequency fc, to pass therethrough and attenuates a frequency component which is higher than or equal to the cutoff frequency fc at a fixed angle of inclination.

For example, in the case of a primary RC filter like the RC low-pass filter 1102, the cutoff frequency fc is expressed as fc=1/(2π$C_1$R). That is, if the resistance value R or the capacitance value $C_1$ is large, the cutoff frequency decreases, which makes it possible to eliminate also noise of a lower frequency component.

However, if the resistance value R or the capacitance value $C_1$ is made larger, the area of the resistance or the capacitance increases, resulting in an increase of the chip size of the circuit. Moreover, in general, the resistance is smaller than the capacitance, but, since the resistance is connected in series to a control line X, if the size of the resistance is increased, higher noise is caused in the RC low-pass filter 1102. The noise caused in the RC low-pass filter 1102 also becomes phase noise in the output signal which is output from the core circuit of the VCO 1100.

Therefore, in general, the resistance of the RC low-pass filter 1102 is increased in size to the extent that noise which is caused in the RC low-pass filter 1102 does not affect phase noise in the output signal and the capacitance is increased in size to the extent that the size is permissible with respect to the chip area.

The reference current source circuit 1101 controls the control voltage $V_{cont}$ by adjusting the reference current and outputs the control voltage $V_{cont}$ to the RC low-pass filter 1102. The RC low-pass filter 1102 removes noise of a high frequency component, the noise contained in the control voltage $V_{cont}$, and outputs the voltage from which the noise is eliminated to the tail transistor 1103 as a voltage $V_{tail}$.

The tail transistor 1103 is a voltage-current converter that outputs the current $I_{tail}$ in accordance with the voltage $V_{tail}$. The core circuit is driven by the current $I_{tail}$ which is output from the tail transistor 1103, and generates an output signal and outputs the output signal from an output terminal.

The cross-coupled transistor 1104 compensates for power losses which are caused in the core circuit. The compensation capability of the cross-coupled transistor 1104 is generally expressed as transconductance (gm) and gm is determined by the current $I_{tail}$ and the size/process of the cross-coupled transistor 1104. Specifically, let a coefficient which is determined by the size/process of the cross-coupled transistor 1104 be β. Then, gm is expressed by Equation 1 below.

$$gm = \sqrt{\beta \cdot I_{tail}} \qquad \text{[Equation 1]}$$

The larger the value of gm is, the higher the compensation capability of the cross-coupled transistor 1104 is.

On the other hand, the LC tank 1105 determines the oscillation frequency $f_o$ of the VCO 1100. The LC tank 1105 is formed of an inductor having an inductance value L and a capacitance having a capacitance value $C_2$. Specifically, the oscillation frequency $f_o$ of the VCO 1100 is expressed by Equation 2 below.

$$f_o = \frac{1}{2\pi\sqrt{L \cdot C_2}} \qquad \text{[Equation 2]}$$

In general, the VCO 1100 changes the oscillation frequency $f_o$ by making the capacitance value $C_2$ variable by using a control signal $T_{osc}$.

Moreover, the loss of the LC tank 1105 is quantified by the Q value. By the use of the Q value, an equivalent parallel resistance Rp is determined. The larger the Q value is, the higher the equivalent parallel resistance Rp is.

In the VCO 1100 depicted in FIG. 1A, an oscillation condition indicating a condition as to whether or not the output signal oscillates is provided. The oscillation condition is affected by the LC tank 1105 and the cross-coupled transistor 1104. Specifically, the oscillation condition is defined as the product of the transconductance gm of the cross-coupled transistor 1104 and the equivalent parallel resistance Rp of the LC tank 1105. If gm·Rp≥1, the oscillation condition is met; if gm·Rp<1, the oscillation condition is not met. Since the equivalent parallel resistance Rp is determined by the loss of the LC tank 1105, it is difficult to make an adjustment after the VCO 1100 is produced. Thus, in general, in order to adjust the oscillation condition by calibration after the VCO 1100 is produced, the current $I_{tail}$ is adjusted to change gm.

The adjustment of the current $I_{tail}$ is made by adjusting the voltage $V_{tail}$ which is output from the RC low-pass filter 1102. Therefore, the wider the variable range of the voltage $V_{tail}$ is, that is, the larger a difference between the maximum value and the minimum value which can be taken by the voltage $V_{tail}$ is, the wider the variable range of the current $I_{tail}$ becomes.

In the existing CMOS process, since an oxide film which is formed between the gate of a transistor and a substrate is thick, a leakage current $I_{leak}$ does not flow. However, in the fine CMOS process which effects operation in a frequency band exceeding 100 GHz, the leakage current $I_{leak}$ flows and therefore the leakage current $I_{leak}$ cannot be ignored. As depicted in FIG. 1A, since the leakage current $I_{leak}$ flows to the resistance of the RC low-pass filter 1102, a voltage drop occurs. If the magnitude of the voltage drop is assumed to be $V_{drop}$, the voltage drop is expressed as follows: $V_{drop}=R \cdot I_{leak}$.

The relationship between the control voltage $V_{cont}$ and the voltage $V_{tail}$ is expressed as follows: $V_{tail}=V_{cont}+V_{drop}$. Thus, unlike the existing CMOS process, in the fine CMOS process which effects operation in a frequency band exceeding 100 GHz, the variable range of the voltage $V_{tail}$ is narrowed depending on the magnitude of $V_{drop}$ and it becomes difficult to make an adjustment of the oscillation condition, that is, an adjustment of the current $I_{tail}$.

For example, in IEEE JOURNAL OF SOLID-STATE CIRCUITS, VOL. 42, NO. 9, SEPTEMBER 2007, the configuration of a VCO that can control the oscillation condition is described. The configuration described in IEEE JOURNAL OF SOLID-STATE CIRCUITS, VOL. 42, NO. 9, SEPTEMBER 2007 is formed of a VCO, a differential squaring circuit that converts an oscillation signal of the VCO into a DC signal commensurate with the oscillation level, a DC cut capacitance that removes a DC value which appears in the output of the differential squaring circuit, a comparator that determines whether or not there is a difference among differential components which are output from the DC cut capacitance, a determination circuit that outputs a control signal based on the output of the comparator, and a current source circuit that determines the current value of the VCO based on the output of the determination circuit. With this configuration, it is possible to detect a current value flowing through the VCO, the current value which is necessary for the VCO to oscillate.

However, in the above-described existing technique of IEEE JOURNAL OF SOLID-STATE CIRCUITS, VOL. 42, NO. 9, SEPTEMBER 2007, an RC filter is not provided and therefore noise contained in the current flowing through the VCO becomes phase noise in the oscillation signal. For example, as in the configuration depicted in FIG. 1A, even when an RC filter formed of a resistance and a capacitance is inserted into the VCO, the variable range of the voltage $V_{tail}$ is narrowed and it is difficult to make an adjustment of the oscillation condition, that is, an adjustment of the current $I_{tail}$.

In view of these circumstances, the inventors of the present disclosure have focused on the fact that, by providing an RC low-pass filter in a voltage control oscillation circuit and controlling the resistance value of a resistance of the RC low-pass filter, it is possible to curb the influence of a voltage drop and attained the present disclosure.

Hereinafter, embodiments of the present disclosure will be described in detail with reference to the drawings. Incidentally, each embodiment which will be described below is an example and the present disclosure is not limited by these embodiments.

First Embodiment

Figure 2:
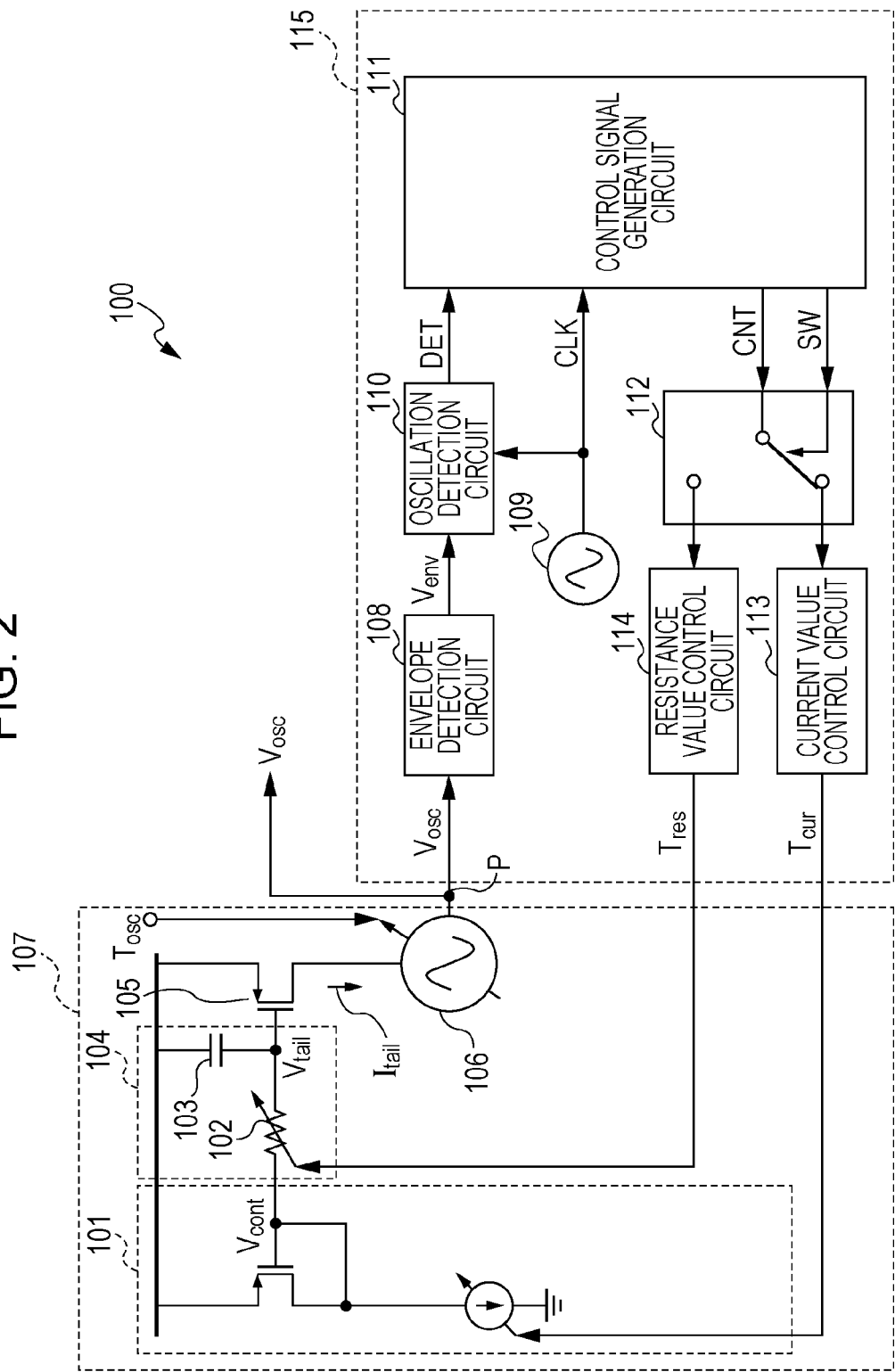
FIG. 2 is a block diagram depicting a configuration example of an oscillation signal generation circuit according to a first embodiment of the present disclosure.

FIG. 2 is a block diagram depicting a configuration example of an oscillation signal generation circuit 100 according to a first embodiment of the present disclosure. As depicted in FIG. 2, the oscillation signal generation circuit 100 includes a voltage controlled oscillator 107 and a calibration circuit 115. The voltage controlled oscillator 107 has a reference current source circuit 101, an RC low-pass filter 104 having a variable resistance 102 and a capacitance 103, a tail transistor 105, and a core circuit 106. The calibration circuit 115 has an envelope detection circuit 108, a clock generation circuit 109, an oscillation detection circuit 110, a control signal generation circuit 111, a switch 112, a current value control circuit 113, and a resistance value control circuit 114.

The reference current source circuit 101 has a current source whose current value is variable and outputs a control voltage $V_{cont}$ to the RC low-pass filter 104 based on a current value which is controlled by the current value control circuit 113. In this embodiment, description is given based on the premise that the control voltage $V_{cont}$ is generated by the reference current source circuit 101 having the current source; alternatively, the control voltage $V_{cont}$ may be generated by a circuit having a voltage source whose voltage value is variable in place of the current source. Incidentally, in the configuration of the reference current source circuit 101 depicted in FIG. 2, the larger the current value which is output from the current source is, the lower the control voltage $V_{cont}$ becomes.

The RC low-pass filter 104 has the variable resistance 102 and the capacitance 103 and removes, from the control voltage $V_{cont}$, noise whose frequency is higher than a cutoff frequency which is determined by the resistance value of the variable resistance 102 and the capacitance value of the capacitance 103. The RC low-pass filter 104 outputs the voltage from which the noise is eliminated to the tail transistor 105 as a voltage $V_{tail}$. Incidentally, in the configuration of the reference current source circuit 101 depicted in FIG. 2, the smaller the resistance value of the variable resistance 102 is, the lower the voltage $V_{tail}$ becomes.

The tail transistor 105 is a voltage-current converter that generates a current $I_{tail}$ based on the voltage $V_{tail}$ which is input as a gate voltage. The tail transistor 105 outputs the current $I_{tail}$ to the core circuit 106. Incidentally, in the configuration of the tail transistor 105 depicted in FIG. 2, the lower the voltage $V_{tail}$ is, the larger the current $I_{tail}$ becomes.

The core circuit 106 has, for example, a cross-coupled transistor (not depicted in the drawing) having transconductance (gm) commensurate with the current $I_{tail}$ and an LC tank (not depicted in the drawing) formed of an inductor that controls an oscillation frequency and a variable capacitance. The core circuit 106 is driven by the current $I_{tail}$ and outputs, from an output terminal P, an output signal $V_{osc}$ of the oscillation frequency which is adjusted by a signal $T_{osc}$. Incidentally, the core circuit 106 may be a ring oscillator.

With the configuration described above, the voltage controlled oscillator 107 outputs the output signal $V_{osc}$ from the output terminal P.

In the voltage controlled oscillator 107, the lower the control voltage $V_{cont}$ is, the lower the voltage $V_{tail}$ becomes, and, the lower the voltage $V_{tail}$ is, the larger the current $I_{tail}$ becomes. Moreover, the larger the current $I_{tail}$ is, the higher the output signal $V_{osc}$ becomes and the larger the value of gm becomes. Since the possibility that the output signal $V_{osc}$ oscillates (that is, the possibility that the oscillation condition is met) is increased with an increase in the value of gm, the oscillation condition is stabilized.

In other words, a determination as to whether or not the output signal $V_{osc}$ oscillates (that is, whether or not the voltage controlled oscillator 107 meets the oscillation condition) is made based on the current $I_{tail}$. The calibration circuit 115 according to this embodiment is configured so as to adjust the current $I_{tail}$ such that the output signal $V_{osc}$ oscillates (that is, the voltage controlled oscillator 107 meets the oscillation condition).

Specifically, the calibration circuit 115 connects to the output terminal P and receives the output signal $V_{osc}$ and detects whether or not the output signal $V_{osc}$ is oscillating. Then, the calibration circuit 115 adjusts the current $I_{tail}$ by controlling the variable resistance 102 or the reference current source circuit 101 in accordance with the detection result. Hereinafter, each component element of the calibration circuit 115 will be described.

The envelope detection circuit 108 is connected to the output terminal P and receives the output signal $V_{osc}$. The envelope detection circuit 108 detects an envelope of the output signal $V_{osc}$ and outputs the detected envelope to the oscillation detection circuit 110 as an envelope voltage $V_{env}$.

The clock generation circuit 109 generates a clock signal CLK and outputs the generated clock signal CLK to the oscillation detection circuit 110 and the control signal generation circuit 111.

The oscillation detection circuit 110 detects the value of the envelope voltage $V_{env}$ on the rising edge of the clock signal CLK and outputs, to the control signal generation circuit 111, a detection signal DET indicating whether or not the output signal $V_{osc}$ is oscillating. Specifically, the oscillation detection circuit 110 outputs a high ("H")-level detection signal DET if the output signal $V_{osc}$ is oscillating and outputs a low ("L")-level detection signal DET if the output signal $V_{osc}$ is not oscillating. The oscillation detection circuit 110 may detect the value of the envelope voltage $V_{env}$ on the falling edge of the clock signal CLK. Incidentally, the oscillation detection circuit 110 may output a low ("L")-level detection signal DET if the output signal $V_{osc}$ is oscillating and output a high ("H")-level detection signal DET if the output signal $V_{osc}$ is not oscillating.

Incidentally, configuration examples of the envelope detection circuit 108 and the oscillation detection circuit 110 will be described later.

The control signal generation circuit 111 generates an oscillation control signal CNT that controls the reference current source circuit 101 or the variable resistance 102 and a switch control signal SW that controls switching of the switch 112 on the rising edge of the clock signal CLK based on the detection result indicated by the detection signal DET and outputs the signals to the switch 112. Incidentally, a specific configuration example of the control signal generation circuit 111 will be described later.

The switch 112 switches an output destination of the oscillation control signal CNT to either the current value control circuit 113 or the resistance value control circuit 114 based on the switch control signal SW. Incidentally, in this embodiment, as initial setting, the switch 112 is connected in such a way as to output the oscillation control signal CNT to the current value control circuit 113.

The current value control circuit 113 outputs a control signal $T_{cur}$ that controls the current value of the current source of the reference current source circuit 101 to the reference current source circuit 101 based on the oscillation control signal CNT. Incidentally, a configuration example of the current value control circuit 113 will be described later along with a configuration example of the reference current source circuit 101.

The resistance value control circuit 114 outputs a control signal $T_{res}$ that controls the resistance value of the variable resistance 102 to the variable resistance 102 based on the oscillation control signal CNT. Incidentally, a specific configuration example of the resistance value control circuit 114 will be described later along with a configuration example of the variable resistance 102.

The calibration circuit 115 according to this embodiment adjusts the current $I_{tail}$ such that the current $I_{tail}$ increases stepwise by controlling the current value of the current source of the reference current source circuit 101 and the resistance value of the variable resistance 102 stepwise.

For example, a controllable range Imin to Imax of the current value of the current source of the reference current source circuit 101 is divided into a plurality of control levels $N_I$ ($N_I$ is an integer which is greater than or equal to 2) in such a way that a level 0 which is an initial value corresponds to the minimum value Imin and a level $N_I-1$ corresponds to the maximum value Imax. Then, the calibration circuit 115 adjusts the current $I_{tail}$ such that the current $I_{tail}$ increases stepwise by controlling the current value of the current source of the reference current source circuit 101 so as to become larger stepwise from the level 0 to the level $N_I-1$. Incidentally, the initial value of the current value may not be the minimum value Imin.

Moreover, a controllable range Rmax to Rmin of the resistance value of the variable resistance 102 is divided into a plurality of control levels $N_R$ ($N_R$ is an integer which is greater than or equal to 2) in such a way that a level 0 which is an initial value corresponds to the maximum value Rmax and a level $N_R-1$ corresponds to the minimum value Rmin. Then, the calibration circuit 115 adjusts the current $I_{tail}$ such that the current $I_{tail}$ increases stepwise by controlling the resistance value of the variable resistance 102 so as to become smaller stepwise from the level 0 to the level $N_R-1$. Incidentally, the initial value of the resistance value may not be the maximum value Rmax.

The calibration circuit 115 according to this embodiment first controls the current value such that the current value becomes larger from Imin to Imax until the output signal $V_{osc}$ oscillates. Then, if the output signal $V_{osc}$ does not oscillate even when the current value reaches Imax, the calibration circuit 115 controls the resistance value such that the resistance value becomes smaller from Rmax to Rmin.

Incidentally, a method of controlling the current value and the resistance value in the calibration circuit 115 is not limited to the above-described method. For example, the calibration circuit 115 may control the resistance value first; alternatively, a method in which the calibration circuit 115 controls the current value and the resistance value alternately may be adopted. Moreover, the calibration circuit 115 may set the current value at a fixed value and control the resistance value.

Figure 3:
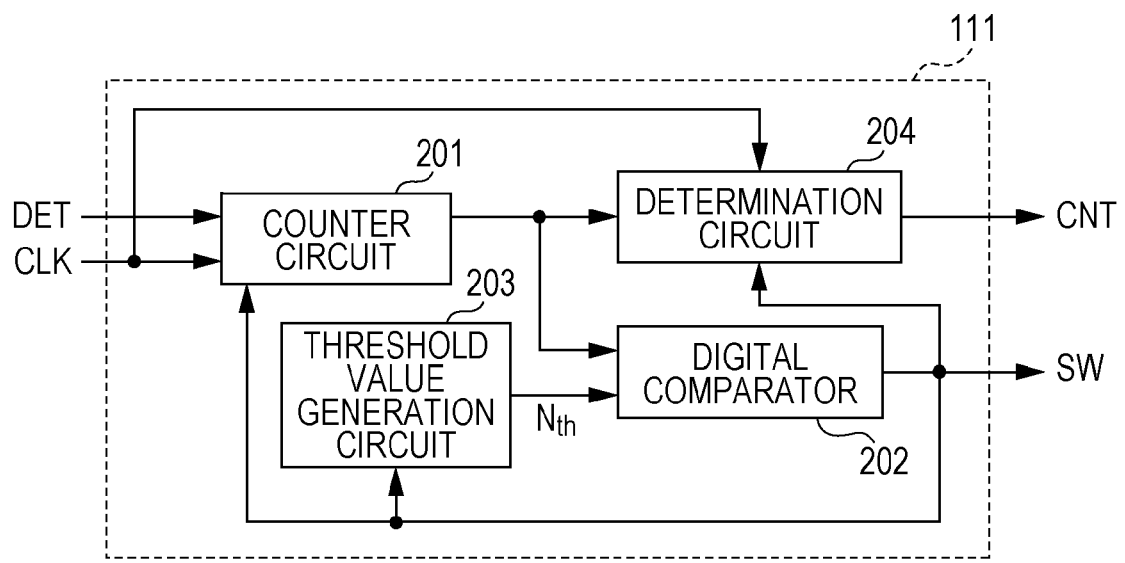
FIG. 3 is a block diagram depicting a first configuration example of the control signal generation circuit according to the first embodiment of the present disclosure.

Next, the configuration example of the control signal generation circuit 111 will be described. FIG. 3 is a block diagram depicting a first configuration example of the control signal generation circuit 111 according to the first embodiment.

The control signal generation circuit 111 depicted in FIG. 3 has a counter circuit 201, a digital comparator 202, a threshold value generation circuit 203, and a determination circuit 204.

The counter circuit 201 receives the detection signal DET and the clock signal CLK and generates the oscillation control signal CNT. Specifically, the counter circuit 201 detects the value of the detection signal DET on the rising edge of the clock signal CLK. Then, if the detected value indicates that the output signal $V_{osc}$ is not oscillating (that is, the oscillation condition is not met), the counter circuit 201 increases the number of counts (increments a count) of the oscillation control signal CNT whose initial value is zero and outputs the oscillation control signal CNT to the digital comparator 202 and the determination circuit 204. Moreover, if the detected value indicates that the output signal $V_{osc}$ is oscillating (that is, the oscillation condition is met), the counter circuit 201 stops counting and does not output the oscillation control signal CNT. Incidentally, the counter circuit 201 may be configured so as to reduce the number of counts (decrement a count) of the oscillation control signal CNT.

With this configuration, the number of counts indicated by the oscillation control signal CNT increments by 1 on the rising edge of the clock signal CLK until the output signal $V_{osc}$ oscillates. The number of counts indicated by the oscillation control signal CNT corresponds to the control level of the current value or the resistance value which is controlled stepwise. That is, the number of counts indicated by the oscillation control signal CNT indicates one value of a plurality of values which the current $I_{tail}$ can take.

Moreover, the counter circuit 201 receives the switch control signal SW. The counter circuit 201 does not initialize the oscillation control signal CNT if the switch control signal SW indicates the output level "L" and initializes the oscillation control signal CNT to zero if the switch control signal SW indicates the output level "H".

The digital comparator 202 outputs the switch control signal SW to the switch 112 and the counter circuit 201 based on the oscillation control signal CNT and a threshold value $N_{th}$ which is output from the threshold value generation circuit 203. The switch control signal SW is a signal that controls switching of the switch 112 and takes either one of the values: the output level "L" indicating that switching is not performed and the output level "H" indicating that switching is performed.

Specifically, the digital comparator 202 compares the oscillation control signal CNT with the threshold value $N_{th}$ and outputs the switch control signal SW at the output level "L" if the oscillation control signal CNT is smaller than the threshold value $N_{th}$. If the oscillation control signal CNT is greater than or equal to the threshold value $N_{th}$, the digital comparator 202 outputs the switch control signal SW at the output level "H". Incidentally, the digital comparator 202 may be configured so as to compare the oscillation control signal CNT with the threshold value $N_{th}$ and output the switch control signal SW at the output level "H" if the oscillation control signal CNT is smaller than the threshold value $N_{th}$ and output the switch control signal SW at the output level "L" if the oscillation control signal CNT is greater than or equal to the threshold value $N_{th}$.

The threshold value generation circuit 203 sets the threshold value $N_{th}$ and outputs the threshold value $N_{th}$ to the digital comparator 202. The threshold value $N_{th}$ is set based on the controllable range of the current value in the current value control circuit 113 and the controllable range of the resistance value in the resistance value control circuit 114. For example, if the calibration circuit 115 controls the current value, the threshold value $N_{th}$ is set at $N_I$; if the calibration circuit 115 controls the resistance value, the threshold value $N_{th}$ is set at $N_R$. The threshold value generation circuit 203 determines whether the calibration circuit 115 controls the current value or the resistance value based on the switch control signal SW and sets the threshold value $N_{th}$.

The determination circuit 204 is a circuit that prevents the oscillation control signal CNT from being output if the oscillation control signal CNT is greater than or equal to the threshold value $N_{th}$. Specifically, the determination circuit 204 receives the oscillation control signal CNT, the switch control signal SW, and the clock signal CLK and outputs the oscillation control signal CNT on the rising edge of the clock signal CLK if the switch control signal SW indicates the output level "L". Moreover, if the switch control signal SW indicates the output level "H", the determination circuit 204 does not output the oscillation control signal CNT after a lapse of a time corresponding to one clock indicated by the clock signal CLK after the determination circuit 204 outputs the oscillation control signal CNT. With this configuration, if the oscillation control signal CNT is greater than or equal to the threshold value $N_{th}$, that is, if the control level of the current value or the resistance value indicated by the oscillation control signal CNT exceeds the controllable range, the determination circuit 204 does not output the oscillation control signal CNT.

With the configuration depicted in FIG. 3, the control signal generation circuit 111 can output the oscillation control signal CNT in such a way that the resistance value is controlled stepwise within the controllable range of the resistance value in the resistance value control circuit 114 after the current value is controlled stepwise within the controllable range of the current value in the current value control circuit 113.

In general, in an oscillator like the voltage controlled oscillator 107 according to this embodiment, along with an oscillation starting condition for making the output signal start oscillating, an oscillation continuance condition for making the output signal continue oscillating after starting oscillation is provided. This oscillation continuance condition is a condition on which a relatively relaxed constraint as compared to the constraint placed on the oscillation starting condition is placed. That is, after the output signal starts oscillating under the oscillation starting condition, the condition can be relaxed. Another configuration example of the control signal generation circuit 111 which will be described below is a configuration in which a search for the oscillation continuance condition is made by relaxing the condition after oscillation is started.

Figure 4:
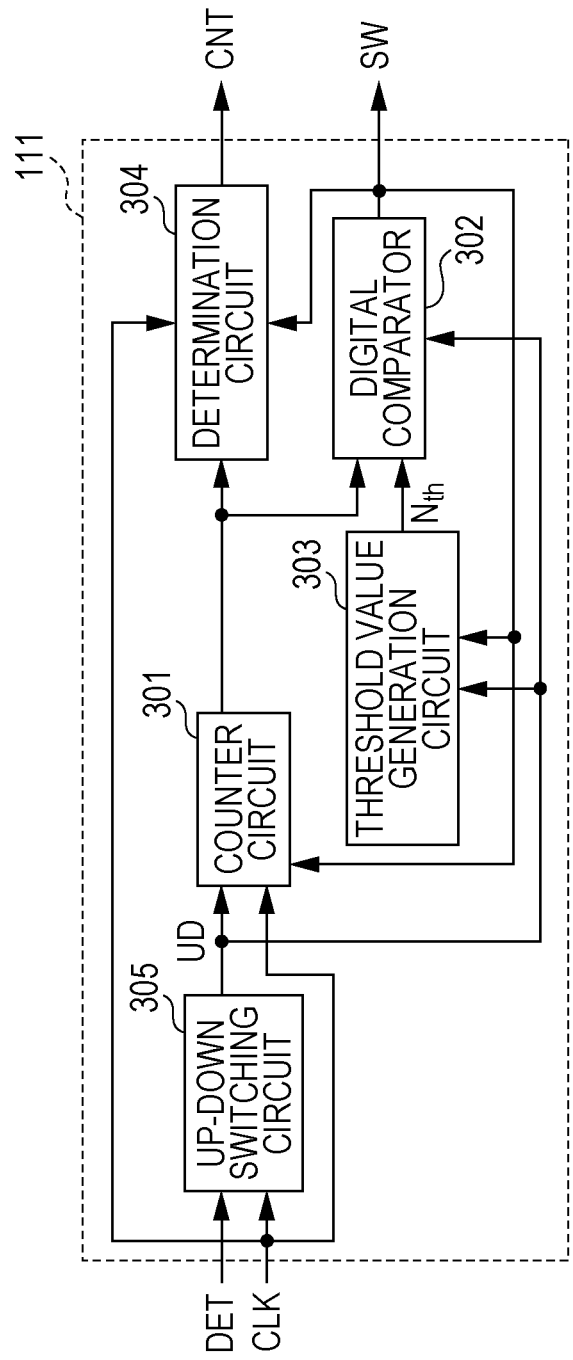
FIG. 4 is a block diagram depicting a second configuration example of the control signal generation circuit according to the first embodiment of the present disclosure.

FIG. 4 is a block diagram depicting a second configuration example of the control signal generation circuit 111 according to the first embodiment.

The control signal generation circuit 111 depicted in FIG. 4 has a counter circuit 301, a digital comparator 302, a threshold value generation circuit 303, a determination circuit 304, and an up-down switching circuit 305.

The up-down switching circuit 305 receives the detection signal DET and the clock signal CLK, and generates an up-down control signal UD and outputs the generated up-down control signal UD to the counter circuit 301, the digital comparator 302, and the threshold value generation circuit 303. The up-down control signal UD is a signal indicating an increase (increment in a count) or a reduction (decrement in a count) in the number of oscillation control signals CNT.

Specifically, the up-down switching circuit 305 detects the value of the detection signal DET on the rising edge of the clock signal CLK. Then, if the detected value indicates that the oscillation condition is not met (that is, the output signal $V_{osc}$ is not oscillating), the up-down switching circuit 305 generates the up-down control signal UD indicating an increase in the number of oscillation control signals CNT (increment in a count) and outputs the generated up-down control signal UD. Moreover, if the detected value indicates that the oscillation condition is met (that is, the output signal $V_{osc}$ is oscillating), the up-down switching circuit 305 generates the up-down control signal UD indicating a reduction in the number of oscillation control signals CNT (decrement in a count) and outputs the generated up-down control signal UD.

If the up-down control signal UD indicates an increase in the number of oscillation control signals CNT (increment in a count), the counter circuit 301 increases the number of oscillation control signals CNT on the rising edge of the clock signal CLK. If the up-down control signal UD indicates a reduction (decrement in a count) in the number of oscillation control signals CNT, the counter circuit 301 reduces the number of oscillation control signals CNT on the rising edge of the clock signal CLK.

The digital comparator 302 outputs a switch control signal SW to the switch 112 and the counter circuit 301 based on the oscillation control signal CNT, a threshold value $N_{th}$ which is output from the threshold value generation circuit 303, and the up-down control signal UD. The switch control signal SW is a signal that controls switching of the switch 112 and takes either one of the values: the output level "L" indicating that switching is not performed and the output level "H" indicating that switching is performed.

Specifically, the digital comparator 302 operates in different manners when the up-down control signal UD indicates an increase in the number of oscillation control signals CNT (increment in a count) and when the up-down control signal UD indicates a reduction in the number of oscillation control signals CNT (decrement in a count).

When the up-down control signal UD indicates an increase in the number of oscillation control signals CNT (increment in a count), the digital comparator 302 compares the oscillation control signal CNT with the threshold value $N_{th}$ and outputs the switch control signal SW at the output level "L" if the oscillation control signal CNT is smaller than the threshold value $N_{th}$. If the oscillation control signal CNT is greater than or equal to the threshold value $N_{th}$, the digital comparator 302 outputs the switch control signal SW at the output level "H".

When the up-down control signal UD indicates a reduction in the number of oscillation control signals CNT (decrement in a count), the digital comparator 302 compares the oscillation control signal CNT with the threshold value $N_{th}$ and outputs the switch control signal SW at the output level "L" if the oscillation control signal CNT is greater than or equal to the threshold value $N_{th}$. If the oscillation control signal CNT is smaller than the threshold value $N_{th}$, the digital comparator 302 outputs the switch control signal SW at the output level "H".

The threshold value generation circuit 303 sets the threshold value $N_{th}$ and outputs the threshold value $N_{th}$ to the digital comparator 302. The threshold value $N_{th}$ is set based on the controllable range of the current value in the current value control circuit 113 and the controllable range of the resistance value in the resistance value control circuit 114. Moreover, the threshold value generation circuit 303 outputs different threshold values when the up-down control signal UD indicates an increase in the number of oscillation control signals CNT (increment in a count) and when the up-down control signal UD indicates a reduction in the number of oscillation control signals CNT (decrement in a count).

For example, if the up-down control signal UD indicates an increase in the number of oscillation control signals CNT (increment in a count) and the current value is controlled, the threshold value $N_{th}$ is set at $N_I$; if the up-down control signal UD indicates an increase in the number of oscillation control signals CNT (increment in a count) and the resistance value is controlled, the threshold value $N_{th}$ is set at $N_R$. Moreover, if the up-down control signal UD indicates a reduction in the number of oscillation control signals CNT (decrement in a count) and the current value is controlled, the threshold value $N_{th}$ is set at a level (that is, zero) corresponding to the minimum value Imin; if the up-down control signal UD indicates a reduction in the number of oscillation control signals CNT (decrement in a count) and the resistance value is controlled, the threshold value $N_{th}$ is set at a level (that is, zero) corresponding to the maximum value Rmax.

The determination circuit 304 does not output the oscillation control signal CNT if the control level indicated by the oscillation control signal CNT is out of the controllable range. Specifically, the determination circuit 304 receives the oscillation control signal CNT, the switch control signal SW, and the clock signal CLK and outputs the oscillation control signal CNT on the rising edge of the clock signal CLK if the switch control signal SW indicates the output level "L". Moreover, if the switch control signal SW indicates the output level "H", the determination circuit 304 does not output the oscillation control signal CNT after a lapse of a time corresponding to one clock indicated by the clock signal CLK after the determination circuit 304 outputs the oscillation control signal CNT.

With the configuration depicted in FIG. 4, the control signal generation circuit 111 can output the oscillation control signal CNT in such a way that control is performed such that the resistance value is made smaller stepwise within the controllable range of the resistance value in the resistance value control circuit 114 after the current value is made larger stepwise within the controllable range of the current value in the current value control circuit 113 when the output signal $V_{osc}$ is not oscillating. Moreover, the control signal generation circuit 111 can output the oscillation control signal CNT in such a way that control is performed such that the current value is made smaller stepwise within the controllable range of the current value in the current value control circuit 113 after the resistance value is made larger stepwise within the controllable range of the resistance value in the resistance value control circuit 114 when the output signal $V_{osc}$ is oscillating.

Figure 5:
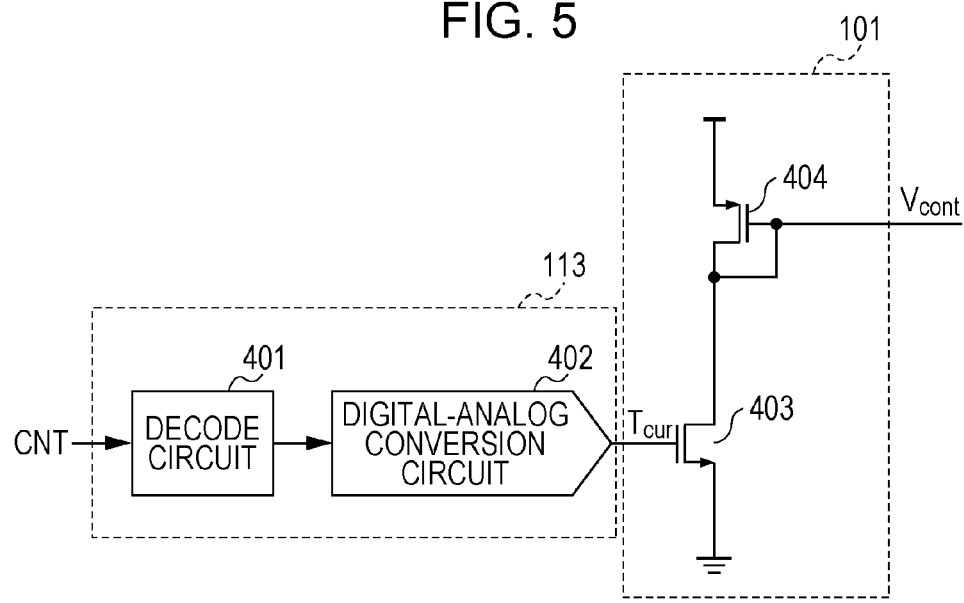
FIG. 5 is a block diagram depicting a first configuration example of a current value control circuit and a current source circuit according to the first embodiment of the present disclosure.

Next, the specific configuration examples of the current value control circuit 113 and the reference current source circuit 101 will be described. FIG. 5 is a block diagram depicting a first configuration example of the current value control circuit 113 and the reference current source circuit 101 according to the first embodiment.

The reference current source circuit 101 depicted in FIG. 5 has an n-type metal-oxide-semiconductor field-effecttransistor (MOSFET) 403 and a p-type MOSFET 404. The source terminal of the n-type MOSFET 403 connects to a ground, the gate terminal thereof connects to a digital-analog conversion circuit 402, and the drain terminal thereof connects to the drain terminal of the p-type MOSFET 404. The source terminal of the p-type MOSFET 404 connects to a power-supply line and the gate terminal thereof connects to the drain terminal of the p-type MOSFET 404. The potential $V_{cont}$ at the gate terminal of the p-type MOSFET 404 is output to the RC low-pass filter 104. Incidentally, one or both of the n-type MOSFET 403 and the p-type MOSFET 404 may have a cascode configuration or the p-type and the n-type may be placed in the positions of the n-type and the p-type, respectively. Moreover, the MOSFET may be other types of transistor.

The current value control circuit 113 depicted in FIG. 5 has a decode circuit 401 and the digital-analog conversion circuit 402.

The decode circuit 401 generates a digital signal based on the oscillation control signal CNT and outputs the digital signal to the digital-analog conversion circuit 402. For example, the decode circuit 401 has a table indicating the correspondence between the number of counts indicated by the oscillation control signal CNT, that is, the control level of the current value and a digital signal of a current value control signal $T_{cur}$ to the gate terminal of the n-type MOSFET 403 for outputting a current value corresponding to the control level and outputs a digital signal of a current value control signal $T_{cur}$ based on the table.

The digital-analog conversion circuit 402 converts the received digital signal into a current value control signal $T_{cur}$ and outputs the current value control signal $T_{cur}$ to the gate terminal of the n-type MOSFET 403. The current value control circuit 113 depicted in FIG. 5 outputs an analog control voltage as the current value control signal $T_{cur}$.

With this configuration, the current value which flows through the reference current source circuit 101 varies in accordance with the current value control signal $T_{cur}$. For example, in the configuration depicted in FIG. 5, the larger the current value control signal $T_{cur}$ becomes, the larger the flowing current value becomes. Then, when the flowing current value becomes larger, the potential $V_{cont}$ decreases. On the other hand, when the current value control signal $T_{cur}$ becomes smaller, the potential $V_{cont}$ increases.

The decode circuit 401 may have a storage that stores the oscillation starting condition and the oscillation continuance condition. Since the oscillation continuance condition is a condition before (a control level before) the condition under which oscillation stops, the decode circuit 401 may have a circuit that calculates that condition. Incidentally, if the resistance value is controlled, the present condition (the present control level), not a condition before the condition under which oscillation stops, is the oscillation continuance condition.

Figure 6:
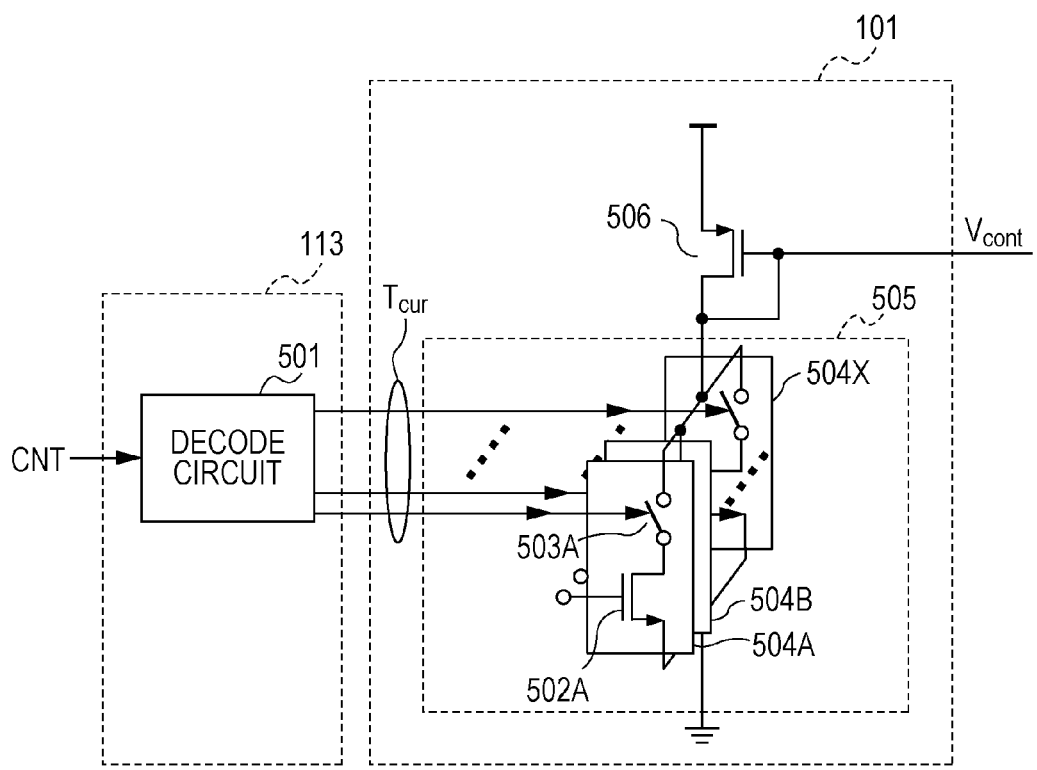
FIG. 6 is a block diagram depicting a second configuration example of the current value control circuit and the current source circuit according to the first embodiment of the present disclosure.

Next, other configuration examples of the current value control circuit 113 and the reference current source circuit 101 will be described. FIG. 6 is a block diagram depicting a second configuration example of the current value control circuit 113 and the reference current source circuit 101 according to the first embodiment.

As depicted in FIG. 6, the current value control circuit 113 has a decode circuit 501. Moreover, the reference current source circuit 101 has a variable current circuit 505 and a p-type MOSFET 506. The variable current circuit 505 has a current control unit 504A including an n-type MOSFET 502A and a switch 503A and current control units 504B to 504X, each having the same configuration as the current control unit 504A.

The decode circuit 501 outputs the current value control signal $T_{cur}$ based on the oscillation control signal CNT. The decode circuit 501 depicted in FIG. 6 outputs, as the current value control signal $T_{cur}$, a signal that controls ON/OFF of the switches 503A to 503X of the variable current circuit 505. For example, the decode circuit 501 has a table indicating the correspondence between the number of counts indicated by the oscillation control signal CNT, that is, the control level of the current value and a signal that controls ON/OFF of the switches 503A to 503X for outputting a current value corresponding to the control level and outputs the current value control signal $T_{cur}$ based on the table.

The source terminal of the n-type MOSFET 502A of the current control unit 504A connects to a ground and the drain terminal thereof connects to the drain terminal of the p-type MOSFET 506 via the switch 503A. Moreover, to the gate terminal of the n-type MOSFET 502A, a fixed potential is applied from an unillustrated bias circuit.

The switch 503A brings the drain terminal of the n-type MOSFET 502A and the drain terminal of the p-type MOSFET 506 into or out of conduction in accordance with the current value control signal $T_{cur}$.

The current control units 504B to 504X also have the same configuration as the current control unit 504A.

The source terminal of the p-type MOSFET 506 connects to a power-supply line and the gate terminal thereof connects to the drain terminal of the p-type MOSFET 506. The potential $V_{cont}$ at the gate terminal of the p-type MOSFET 506 is output to the RC low-pass filter 104.

Incidentally, one or both of the n-type MOSFETs 502A to 502X and the p-type MOSFET 506 may have a cascode configuration or the p-type and the n-type may be placed in the positions of the n-type and the p-type, respectively. Moreover, the switch 503A may be positioned between the source terminal of the n-type MOSFET 502A and the ground or between the gate terminal and the unillustrated bias circuit. When the switch 503A is provided between the gate terminal and the bias circuit, it is more preferable to provide a reset switch that resets the gate-source voltage to about 0 V. The same goes for the positions of the switches 503B to 503X. Moreover, the MOSFET may be other types of transistor.

The variable current circuit 505 changes the number of current control units 504 which are connected to the p-type MOSFET 506 in accordance with the current value control signal $T_{cur}$.

With this configuration, the current value flowing through the reference current source circuit 101 varies in accordance with the current value control signal $T_{cur}$. For example, in the configuration depicted in FIG. 6, the larger the number of current control units 504 which are connected to the p-type MOSFET 506 is, the larger the flowing current value becomes. Then, when the flowing current value becomes larger, the potential $V_{cont}$ decreases. On the other hand, when the number of current control units 504 which are connected to the p-type MOSFET 506 is small, the potential $V_{cont}$ increases.

The decode circuit 501 may have a storage that stores the oscillation start condition and the oscillation continuance condition. Since the oscillation continuance condition is a condition before (a control level before) the condition under which oscillation stops, the decode circuit 501 may have a circuit that calculates that condition. Incidentally, if the resistance value is controlled, the present condition (the present control level), not a condition before the condition under which oscillation stops, is the oscillation continuance condition.

Figure 7:
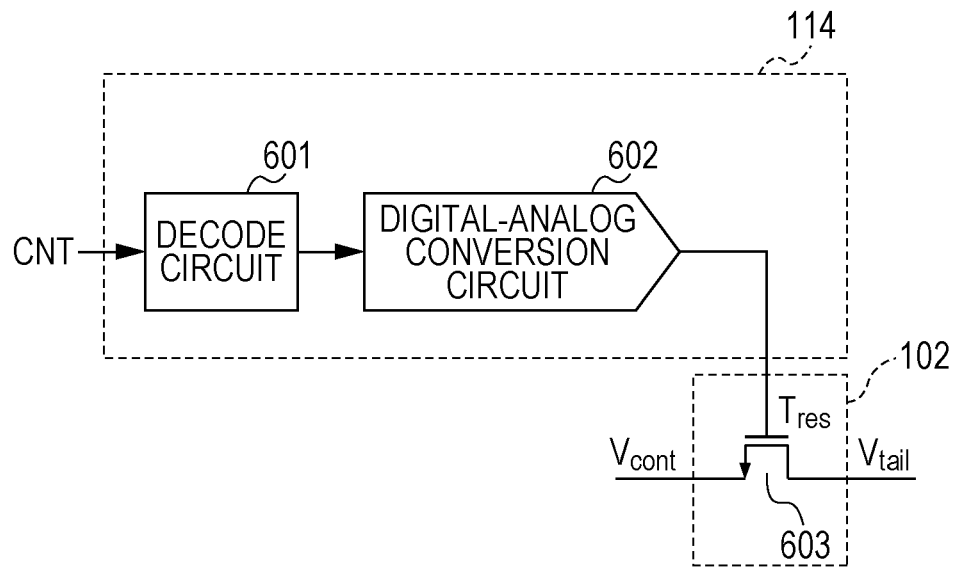
FIG. 7 is a block diagram depicting a first configuration example of a resistance value control circuit and a variable resistance according to the first embodiment of the present disclosure.

Next, the specific configuration examples of the resistance value control circuit 114 and the variable resistance 102 will be described. FIG. 7 is a block diagram depicting a first configuration example of the resistance value control circuit 114 and the variable resistance 102 according to the first embodiment.

The variable resistance 102 depicted in FIG. 7 has an n-type MOSFET 603. The source terminal of the n-type MOSFET 603 connects to the output terminal of the reference current source circuit 101, the gate terminal thereof connects to the output terminal of a digital-analog conversion circuit 602, and the drain terminal thereof connects to the capacitance 103 of the RC low-pass filter 104 and the gate terminal of the tail transistor 105.

Incidentally, the n-type MOSFET 603 may be replaced with a p-type MOSFET. In that case, the drain terminal of the p-type MOSFET connects to the output terminal of the reference current source circuit 101, the gate terminal thereof connects to the output terminal of the digital-analog conversion circuit 602, and the source terminal thereof connects to the capacitance 103 of the RC low-pass filter 104 and the gate terminal of the tail transistor 105.

The capacitance 103 may be, for example, a MIM capacitor, a MOM capacitor, or a MOS capacitor. Moreover, the MOSFET may be other types of transistor. Hereinafter, a case in which the variable resistance 102 has the n-type MOSFET 603 and the tail transistor 105 is a p-type MOSFET will be described.

The resistance value control circuit 114 depicted in FIG. 7 has a decode circuit 601 and the digital-analog conversion circuit 602.

The decode circuit 601 generates a digital signal based on the oscillation control signal CNT and outputs the digital signal to the digital-analog conversion circuit 602. For example, the decode circuit 601 has a table indicating the correspondence between the number of counts indicated by the oscillation control signal CNT, that is, the control level of the resistance value and a digital signal of a resistance value control signal $T_{res}$ to the gate terminal of the n-type MOSFET 603 for obtaining a resistance value corresponding to the control level and outputs a digital signal of a resistance value control signal $T_{res}$ based on the table.

The digital-analog conversion circuit 602 converts the received digital signal into a resistance value control signal $T_{res}$ and outputs the resistance value control signal $T_{res}$ to the gate terminal of the n-type MOSFET 603. The resistance value control circuit 114 depicted in FIG. 7 outputs an analog control voltage as the resistance value control signal $T_{res}$.

With this configuration, the resistance value of the variable resistance 102 varies in accordance with the resistance value control signal $T_{res}$. For example, in the configuration depicted in FIG. 7, the larger the resistance value control signal $T_{res}$ becomes, the smaller the resistance value of the variable resistance 102 becomes. As a result, the leakage current $I_{leak}$ flowing from the tail transistor 105 becomes smaller and the voltage drop caused by the variable resistance 102 is suppressed, and $V_{tail}$ decreases. On the other hand, when the resistance value control signal $T_{res}$ becomes smaller, $V_{tail}$ increases. Moreover, when the tail transistor 105 is an n-type MOSFET, the reverse of what is observed when the tail transistor 105 is a p-type MOSFET is observed.

The decode circuit 601 may have a storage that stores the oscillation starting condition and the oscillation continuance condition. Since the oscillation continuance condition is a condition before (a control level before) the condition under which oscillation stops, the decode circuit 601 may have a circuit that calculates that condition.

Figure 8:
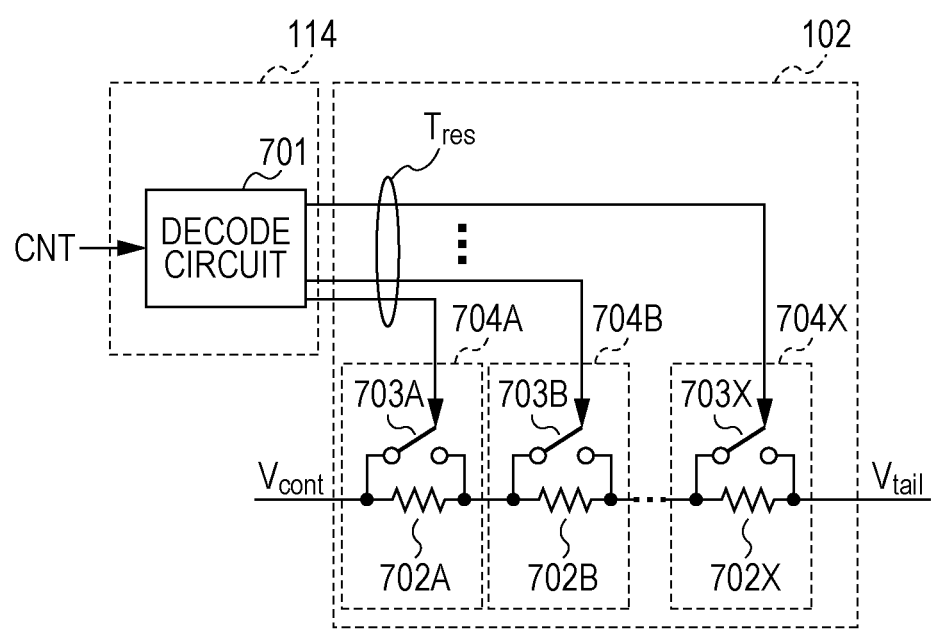
FIG. 8 is a block diagram depicting a second configuration example of the resistance value control circuit and the variable resistance according to the first embodiment of the present disclosure.

Next, other configuration examples of the resistance value control circuit 114 and the variable resistance 102 will be described. FIG. 8 is a block diagram depicting a second configuration example of the resistance value control circuit 114 and the variable resistance 102 according to the first embodiment.

As depicted in FIG. 8, the resistance value control circuit 114 has a decode circuit 701. Moreover, the variable resistance 102 has resistance units 704A to 704X. The resistance unit 704A has a fixed resistance 702A and a switch 703A which is connected in parallel to the fixed resistance 702A. The resistance units 704B to 704X have the same configuration as the resistance unit 704A.

The decode circuit 701 outputs a resistance value control signal $T_{res}$ based on the oscillation control signal CNT. The decode circuit 701 depicted in FIG. 7 outputs, as the resistance value control signal $T_{res}$, a signal that controls ON/OFF of the switches 703A to 703X. For example, the decode circuit 701 has a table indicating the correspondence between the number of counts indicated by the oscillation control signal CNT, that is, the control level of the resistance value and a signal that controls ON/OFF of the switches 703A to 703X for obtaining a resistance value corresponding to the control level and outputs the resistance value control signal $T_{res}$ based on the table.

In the variable resistance 102, the fixed resistances 702A to 702X are connected in series. Then, one of the ends of the fixed resistance 702A, the end which does not connect to the fixed resistance 702B, connects to the output terminal of the reference current source circuit 101, and, one of the ends of the fixed resistance 702X, the end which does not connect to another fixed resistance, connects to the capacitance 103 of the RC low-pass filter 104 and the gate terminal of the tail transistor 105.

The switches 703A to 703X switch ON/OFF in accordance with the resistance value control signal $T_{res}$.

With this configuration, the resistance value of the variable resistance 102 varies in accordance with the resistance value control signal $T_{res}$. For example, in the configuration depicted in FIG. 8, the larger the number of switches 703A to 703X which are turned ON by the resistance value control signal $T_{res}$ is, the smaller the resistance value of the variable resistance 102 becomes. As a result, the leakage current $I_{leak}$ flowing from the tail transistor 105 becomes smaller and the voltage drop caused by the variable resistance 102 is suppressed, and $V_{tail}$ decreases. On the other hand, the smaller the number of switches 703A to 703X which are turned ON by the resistance value control signal $T_{res}$ is, the higher $V_{tail}$ becomes. Moreover, when the tail transistor 105 is an n-type MOSFET, the reverse of what is observed when the tail transistor 105 is a p-type MOSFET is observed.

The decode circuit 701 may have a storage that stores the oscillation starting condition and the oscillation continuance condition. Since the oscillation continuance condition is a condition before (a control level before) the condition under which oscillation stops, the decode circuit 701 may have a circuit that calculates that condition.

Figure 9A:
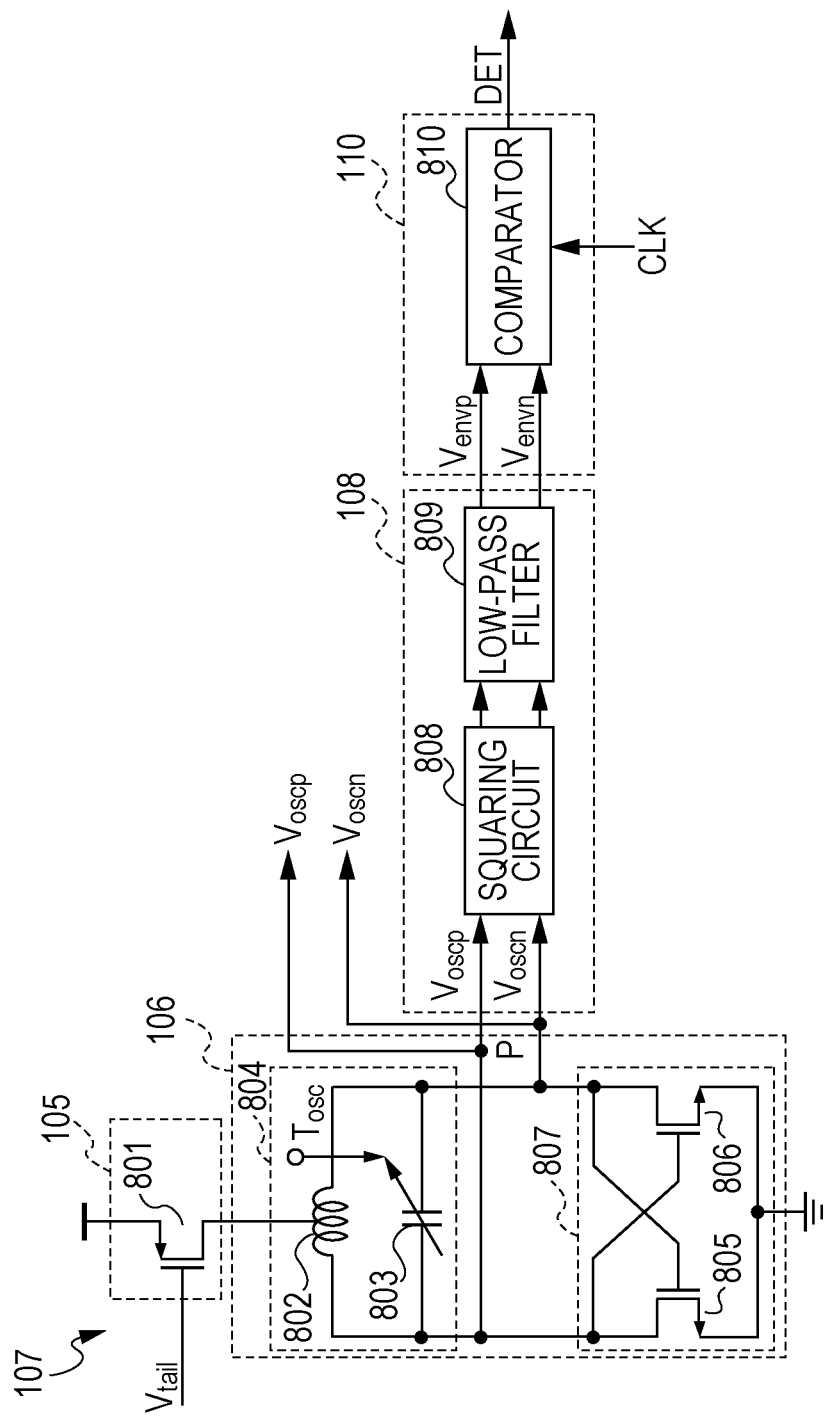
FIG. 9A is a block diagram depicting a first configuration example of a voltage controlled oscillator, an envelope detection circuit, and an oscillation detection circuit according to the first embodiment of the present disclosure.

Next, the specific configuration examples of the voltage controlled oscillator 107, the envelope detection circuit 108, and the oscillation detection circuit 110 will be described. FIG. 9A is a block diagram depicting a first configuration example of the voltage controlled oscillator 107, the envelope detection circuit 108, and the oscillation detection circuit 110 according to the first embodiment. In the voltage controlled oscillator 107 in FIG. 9A, the reference current source circuit 101 and the variable resistance 102 which have been described above are omitted.

The tail transistor 105 is formed as a p-type MOSFET 801. Incidentally, the tail transistor 105 may be formed as an n-type MOSFET.

The core circuit 106 has an LC tank portion 804 including an inductor 802 and a variable capacitance 803 and a cross-coupled transistor 807 including two n-type MOSFETs 805 and 806. Incidentally, the cross-coupled transistor 807 may be formed of two p-type MOSFETs or may be formed of two p-type MOSFETs and two n-type MOSFETs. Moreover, the MOSFET may be other types of transistor.

The LC tank portion 804 has a configuration in which the inductor 802 and the variable capacitance 803 are connected in parallel. The capacitance value of the variable capacitance 803 is set by a control signal $T_{OSC}$.

The gate terminal of the p-type MOSFET 801 connects to a power-supply line and the drain terminal thereof connects to a midpoint of the inductor 802. The source terminal of the p-type MOSFET 801 connects to the output end of the RC low-pass filter 104 and receives the voltage $V_{tail}$.

The source terminals of the n-type MOSFET 805 and the n-type MOSFET 806 connect to a ground. The gate terminal of the n-type MOSFET 805 connects to the drain terminal of the n-type MOSFET 806 and one of the terminals of the LC tank portion 807. The drain terminal of the n-type MOSFET 805 connects to the gate terminal of the n-type MOSFET 806 and the other terminal of the LC tank portion 807.

With this configuration, the voltage controlled oscillator 107 outputs output signals $V_{oscp}$ and $V_{oscn}$ from the drain terminal of the n-type MOSFET 805 and the drain terminal of the n-type MOSFET 806, respectively. The output signals $V_{oscp}$ and $V_{oscn}$ are differential signals with opposite signs.

The envelope detection circuit 108 has a squaring circuit 808 and a low-pass filter 809, and connects to the output terminal of the voltage controlled oscillator 107 and receives the output signals $V_{oscp}$ and $V_{oscn}$.

The squaring circuit 808 outputs, to the low-pass filter 809, a signal obtained as the square of either the output signal $V_{oscp}$ or $V_{oscn}$ and a signal obtained by multiplying the output signals $V_{oscp}$ and $V_{oscn}$. If the output signals $V_{oscp}$ and $V_{oscn}$ are oscillating at a predetermined frequency, the signal output from the squaring circuit 808 contains a component having a frequency which is twice as high as the predetermined frequency and a DC component.

The low-pass filter 809 removes the component having a frequency which is twice as high as the predetermined frequency, the component contained in the signal output from the squaring circuit 808, and outputs DC components $V_{envp}$ and $V_{envn}$ to the oscillation detection circuit 110. Incidentally, the DC components $V_{envp}$ and $V_{envn}$ respectively correspond to a positive envelope amplitude and a negative envelope amplitude which are obtained from the output signals $V_{oscp}$ and $V_{oscn}$.

The oscillation detection circuit 110 has a comparator 810. The comparator 810 receives the DC components $V_{envp}$ and $V_{envn}$, receives the clock signal CLK from the clock generation circuit 109 (see FIG. 2), and outputs the detection signal DET.

The comparator 810 detects the values of the DC components $V_{envp}$ and $V_{envn}$ on the rising edge of the clock signal CLK and performs a comparison between the values. If there is no difference between the DC components $V_{envp}$ and $V_{envn}$, the comparator 810 does not change the detection signal DET and keeps the detection signal DET at the initial value; if there is a difference between the DC components $V_{envp}$ and $V_{envn}$, the comparator 810 changes the detection signal DET.

Incidentally, the comparator 810 may perform detection and comparison on the falling edge of the clock signal CLK.

Moreover, in order to avoid a malfunction caused by noise, the input and output characteristics of the comparator 810 may be provided with hysteresis. In that case, it is necessary to set the initial output value of the comparator 810 at "L" or "H". For example, at a time point at which the comparator 810 does not perform detection and comparison (on the falling edge of the clock signal CLK, for example), the value may be reset to the initial value at which the output of the comparator 810 is set. With this configuration, it is possible to support also the second configuration example of the control signal generation circuit 111 according to this embodiment.

Figure 9B:
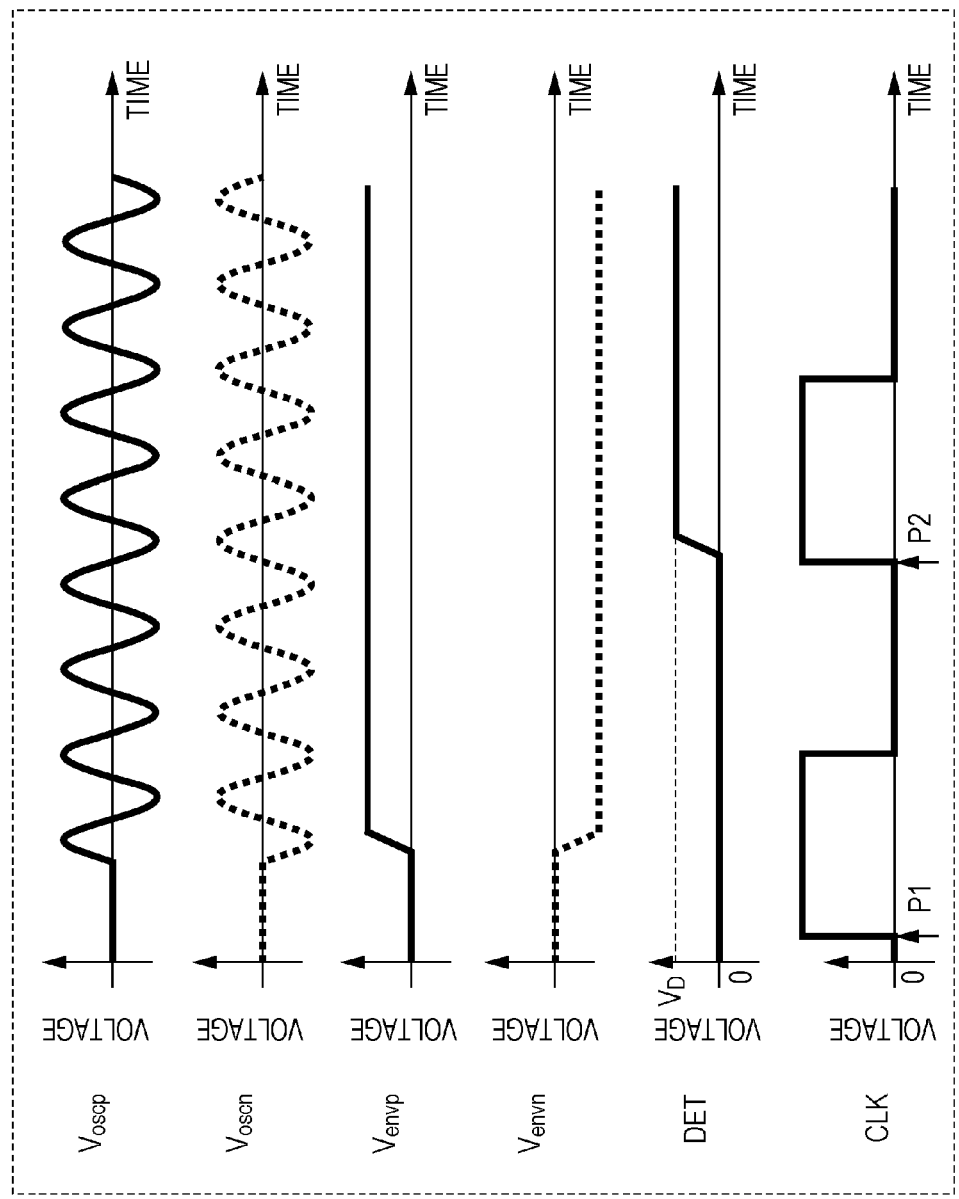
FIG. 9B is a diagram depicting examples of input-output signal waveforms of the voltage controlled oscillator, the envelope detection circuit, and the oscillation detection circuit in the first embodiment of the present disclosure.

Here, examples of the signals which are input and output to and from the voltage controlled oscillator 107, the envelope detection circuit 108, and the oscillation detection circuit 110 which are depicted in FIG. 9A will be described. FIG. 9B is a diagram depicting examples of input-output signal waveforms of the voltage controlled oscillator 107, the envelope detection circuit 108, and the oscillation detection circuit 110 in this embodiment.

As depicted in FIG. 9B, the output signals $V_{oscp}$ and $V_{oscn}$ are differential signals with opposite signs. The DC components $V_{envp}$ and $V_{envn}$ respectively correspond to a positive envelope amplitude and a negative envelope amplitude which are obtained from the output signals $V_{oscp}$ and $V_{oscn}$. If the output signals $V_{oscp}$ and $V_{oscn}$ are not oscillating, the DC components $V_{envp}$ and $V_{envn}$ are zero. Moreover, if the output signals $V_{oscp}$ and $V_{oscn}$ are oscillating, the DC components $V_{envp}$ and $V_{envn}$ have DC components with opposite signs.

Moreover, in the clock signal CLK of FIG. 9B, two rising-edge time points P1 and P2 are depicted. Here, the operation of the comparator 810 at the time points P1 and P2 will be described.

First, the comparator 810 detects the values of the DC components $V_{envp}$ and $V_{envn}$ at the time point P1 and performs a comparison between the values. In the case of FIG. 9B, since there is no difference between the DC components $V_{envp}$ and $V_{envn}$ at the time point P1, the comparator 810 does not change the detection signal DET and keeps the detection signal DET at the initial value.

Next, the comparator 810 detects the values of the DC components $V_{envp}$ and $V_{envn}$ at the time point P2 and performs a comparison between the values. In the case of FIG. 9B, since there is a difference between the DC components $V_{envp}$ and $V_{envn}$ at the time point P2, the comparator 810 changes the detection signal DET from zero to $V_D$.

As described above, when the output signal $V_{oscp}$ and $V_{oscn}$ are oscillating, the comparator 810 generates, by changing the detection signal DET from zero to $V_D$, the detection signal DET indicating whether or not the output signal $V_{osc}$ is oscillating. Incidentally, in the above description, the detection signal DET is assumed to be a binary signal of zero and $V_D$, but the present disclosure is not limited thereto.

Moreover, in the above description, the comparator 810 changes the value of the detection signal DET depending on whether or not there is a difference between the values of the DC components $V_{envp}$ and $V_{envn}$, but the comparator 810 may compare the difference between the DC components $V_{envp}$ and $V_{envn}$ with a predetermined threshold value and change the value of the detection signal DET in accordance with the comparison result.

Figure 10A:
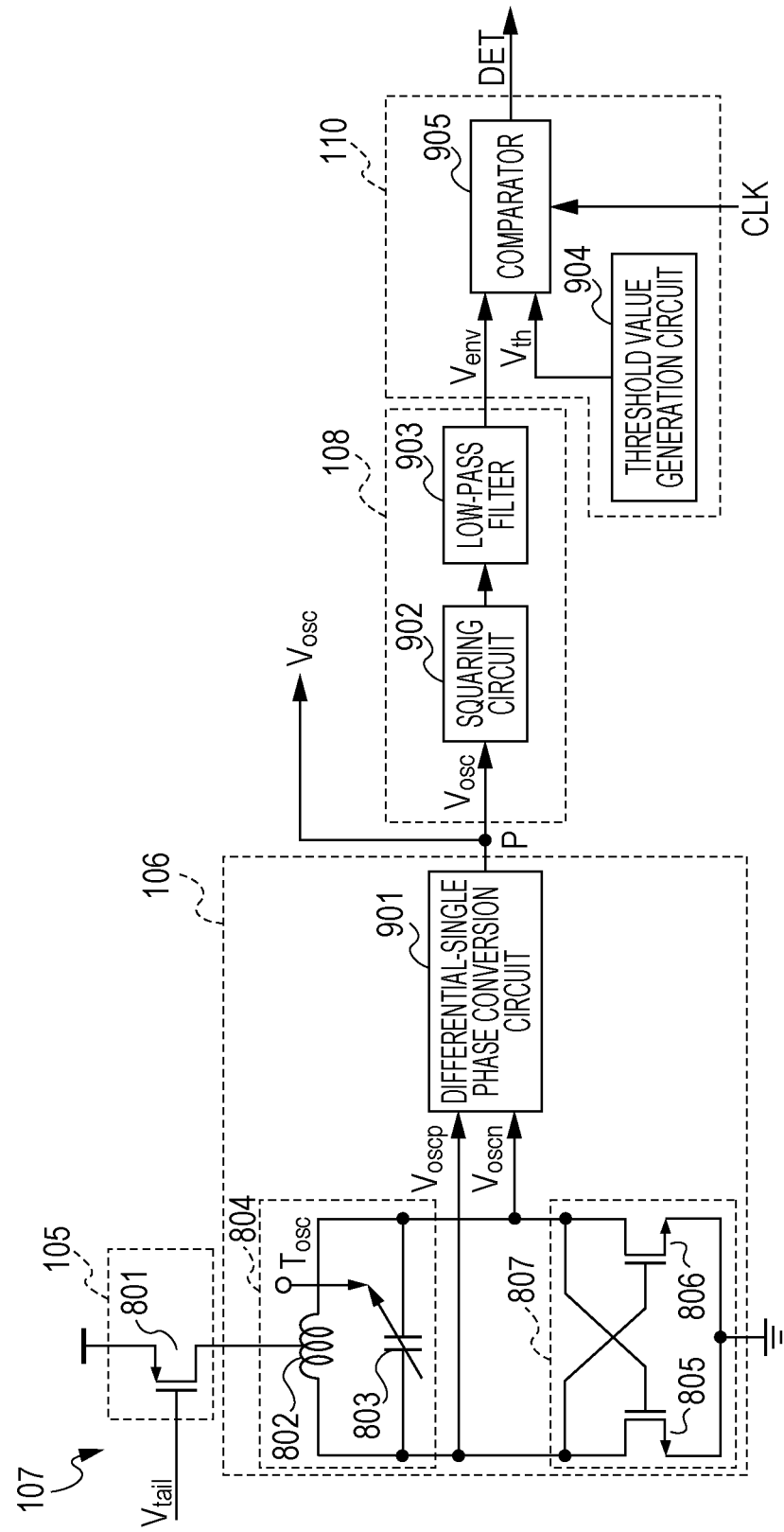
FIG. 10A is a block diagram depicting a second configuration example of the voltage controlled oscillator, the envelope detection circuit, and the oscillation detection circuit according to the first embodiment of the present disclosure.

Next, other configuration examples of the voltage controlled oscillator 107, the envelope detection circuit 108, and the oscillation detection circuit 110 will be described. FIG. 10A is a block diagram depicting a second configuration example of the voltage controlled oscillator 107, the envelope detection circuit 108, and the oscillation detection circuit 110 according to the first embodiment. In the voltage controlled oscillator 107 in FIG. 10A, the reference current source circuit 101 and the variable resistance 102 which have been described above are omitted. Moreover, in FIG. 10A, such component elements as are found also in FIG. 9A will be identified with the same reference characters and their detailed explanations will be omitted.

The second configuration example depicted in FIG. 10A has a differential to single phase conversion circuit 901 that converts the differential output signals $V_{oscp}$ and $V_{oscn}$ in the first configuration example depicted in FIG. 9A into a single-phase output signal $V_{osc}$. Moreover, the configurations of the envelope detection circuit 108 and the oscillation detection circuit 110 depicted in FIG. 10A differ from the configurations depicted in FIG. 9A.

The differential to single phase conversion circuit 901 converts the differential output signals $V_{oscp}$ and $V_{oscn}$ which are respectively output from the drain terminal of the n-type MOSFET 805 and the drain terminal of the n-type MOSFET 806 into a single-phase output signal $V_{osc}$. Incidentally, the differential to single phase conversion circuit 901 may be provided in the envelope detection circuit 108.

The envelope detection circuit 108 depicted in FIG. 10A has a squaring circuit 902 and a low-pass filter 903, and connects to the output terminal of the differential to single phase conversion circuit 901 of the voltage controlled oscillator 107 and receives the output signal $V_{osc}$.

The squaring circuit 902 squares the output signal $V_{osc}$ and outputs the output signal squared to the low-pass filter 903. If the output signal $V_{osc}$ is oscillating at a predetermined frequency, the output signal squared contains a component having a frequency which is twice as high as the predetermined frequency and a DC component.

The low-pass filter 903 removes the component having a frequency which is twice as high as the predetermined frequency, the component contained in the signal squared, and outputs a DC component $V_{env}$ to the oscillation detection circuit 110. Incidentally, the DC component $V_{env}$ corresponds to the envelope amplitude of the output signal $V_{osc}$.

The oscillation detection circuit 110 has a threshold value generation circuit 904 and a comparator 905. The threshold value generation circuit 904 generates a predetermined threshold value $V_{th}$ and outputs the threshold value $V_{th}$ to the comparator 905. The comparator 905 receives the DC component $V_{env}$ and the threshold value $V_{th}$, receives the clock signal CLK from the clock generation circuit 109 (see FIG. 2), and outputs the detection signal DET.

The comparator 905 detects the value of the DC component $V_{env}$ on the rising edge of the clock signal CLK and compares the detected value with the threshold value $V_{th}$. If the value of the DC component $V_{env}$ is smaller than the threshold value $V_{th}$, the comparator 905 does not change the detection signal DET and keeps the detection signal DET at the initial value; if the value of the DC component $V_{env}$ is greater than or equal to the threshold value $V_{th}$, the comparator 905 changes the detection signal DET.

Incidentally, if the value of the DC component $V_{env}$ is smaller than or equal to the threshold value $V_{th}$, the comparator 905 may not change the detection signal DET and may keep the detection signal DET at the initial value; if the value of the DC component $V_{env}$ is greater than the threshold value $V_{th}$, the comparator 905 may change the detection signal DET. Moreover, the comparator 905 may perform detection and comparison on the falling edge of the clock signal CLK.

Moreover, in order to avoid a malfunction caused by noise, the input and output characteristics of the comparator 905 may be provided with hysteresis. In that case, it is necessary to set the initial output value of the comparator 905 at "L" or "H". For example, at a time point at which the comparator 905 does not perform detection and comparison (on the falling edge of the clock signal CLK, for example), the value may be reset to the initial value at which the output of the comparator 905 is set. With this configuration, it is possible to support also the second configuration example of the control signal generation circuit 111 according to this embodiment.

Figure 10B:
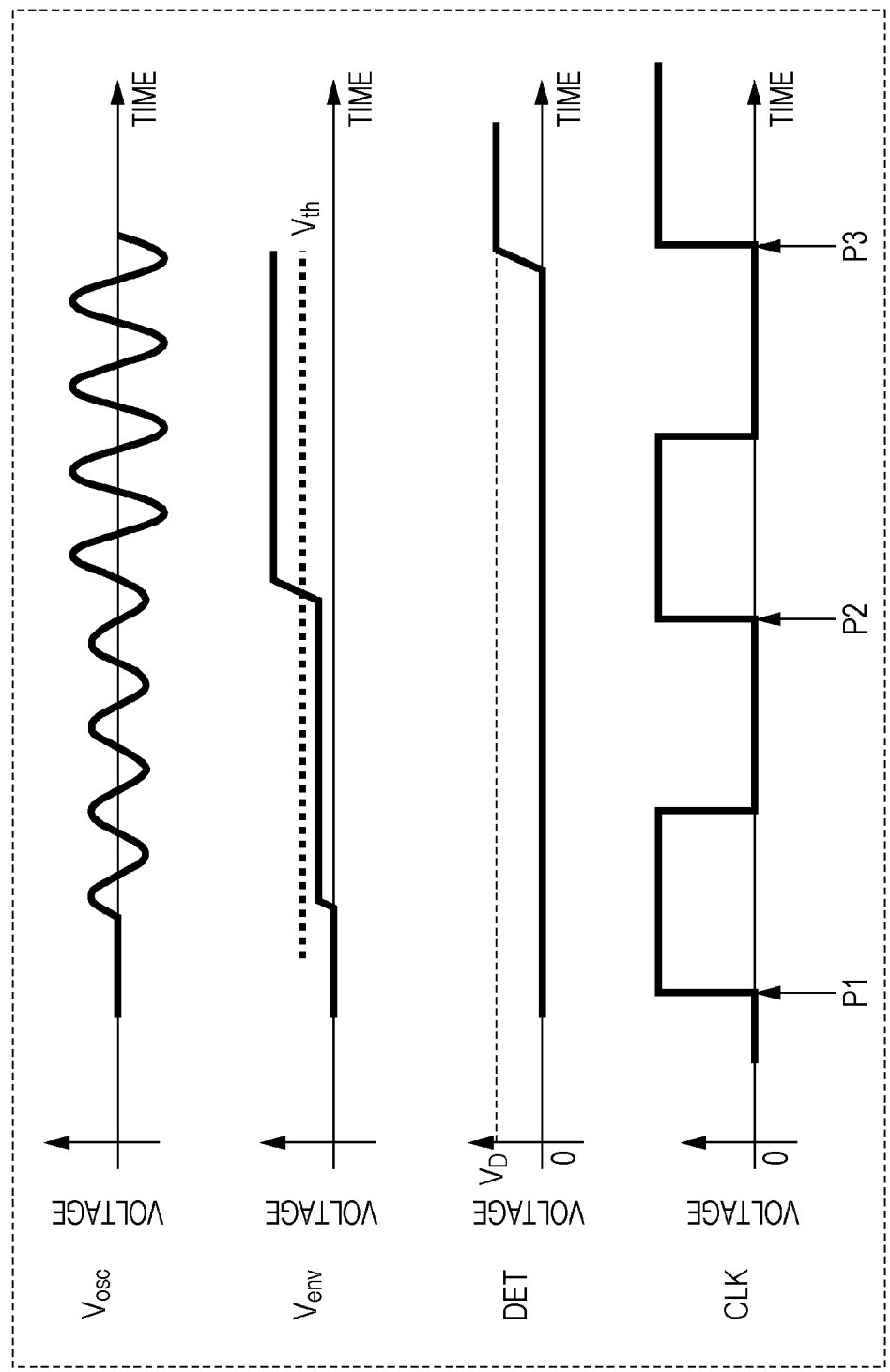
FIG. 10B is a diagram depicting examples of input-output signal waveforms of the voltage controlled oscillator, the envelope detection circuit, and the oscillation detection circuit in the first embodiment of the present disclosure.

Here, examples of the signals which are input and output to and from the voltage controlled oscillator 107, the envelope detection circuit 108, and the oscillation detection circuit 110 which are depicted in FIG. 10A will be described. FIG. 10B is a diagram depicting examples of input-output signal waveforms of the voltage controlled oscillator 107, the envelope detection circuit 108, and the oscillation detection circuit 110 in this embodiment.

As depicted in FIG. 10B, the output signal $V_{osc}$ is a single-phase signal. The DC component $V_{env}$ corresponds to the envelope amplitude of the output signal $V_{osc}$. If the output signal $V_{osc}$ is not oscillating, the DC component $V_{env}$ is zero. Moreover, if the output signal $V_{osc}$ is oscillating, the DC component $V_{env}$ has a DC component with a magnitude commensurate with the amplitude of oscillation. Furthermore, for the DC component $V_{env}$, the threshold value $V_{th}$ is depicted.

Moreover, in the clock signal CLK of FIG. 10B, three rising-edge time points P1, P2, and P3 are depicted. Here, the operation of the comparator 905 at the time points P1, P2, and P3 will be described.

First, the comparator 905 detects the value of the DC component $V_{env}$ at the time point P1 and compares the detected value with the threshold value $V_{th}$. In the case of FIG. 10B, since the output signal $V_{osc}$ is not oscillating at the time point P1, the DC component $V_{env}$ is zero. Thus, since the value of the DC component $V_{env}$ at the time point P1 is smaller than the threshold value $V_{th}$, the comparator 905 does not change the detection signal DET and keeps the detection signal DET at the initial value, that is, zero.

Next, the comparator 905 detects the value of the DC component $V_{env}$ at the time point P2 and compares the detected value with the threshold value $V_{th}$. In the case of FIG. 10B, at the time point P2, although the output signal $V_{osc}$ is oscillating, the amplitude of oscillation is small. Thus, since the DC component $V_{env}$ at the time point P2 is smaller than the threshold value $V_{th}$, the comparator 905 does not change the detection signal DET and keeps the detection signal DET at the initial value, that is, zero.

Next, the comparator 905 detects the value of the DC component $V_{env}$ at the time point P3 and compares the detected value with the threshold value $V_{th}$. In the case of FIG. 10B, at the time point P3, the output signal $V_{osc}$ is oscillating with large amplitude. Thus, since the DC component $V_{env}$ at the time point P3 is greater than or equal to the threshold value $V_{th}$, the comparator 905 changes the detection signal DET from zero to $V_D$.

As described above, when the output signal $V_{osc}$ is oscillating, the comparator 905 generates, by changing the detection signal DET from zero to $V_D$, the detection signal DET indicating whether or not the output signal $V_{osc}$ is oscillating. Incidentally, in the above description, the detection signal DET is assumed to be a binary signal of zero and $V_D$, but the present disclosure is not limited thereto.

As described above, with the configuration of the oscillation signal generation circuit described in this embodiment, by inserting a filter having a resistance and a capacitance into a voltage controlled oscillator, it is possible to reduce phase noise in the output signal, and, by controlling the resistance value of the resistance of the filter, it is possible to expand the range of calibration that controls the oscillation condition.

Incidentally, the oscillation signal generation circuit described in this embodiment may have a storage, such as a memory or a register, which stores any one of the oscillation starting condition and the oscillation continuance condition or both.

Second Embodiment

In general, parasitic capacitance or the like which occurs in a core circuit sometimes varies in accordance with the value of a current flowing through the core circuit. As a result, there is a possibility that an output signal from a voltage control oscillation circuit does not oscillate in a desired oscillation frequency range. An oscillation signal generation circuit according to this embodiment adopts a configuration in which control is performed such that an output signal oscillates in a desired oscillation frequency range. A series of loops of confirmation and control of the range of an oscillation frequency in this embodiment is referred to as a frequency range control loop.

Figure 11:
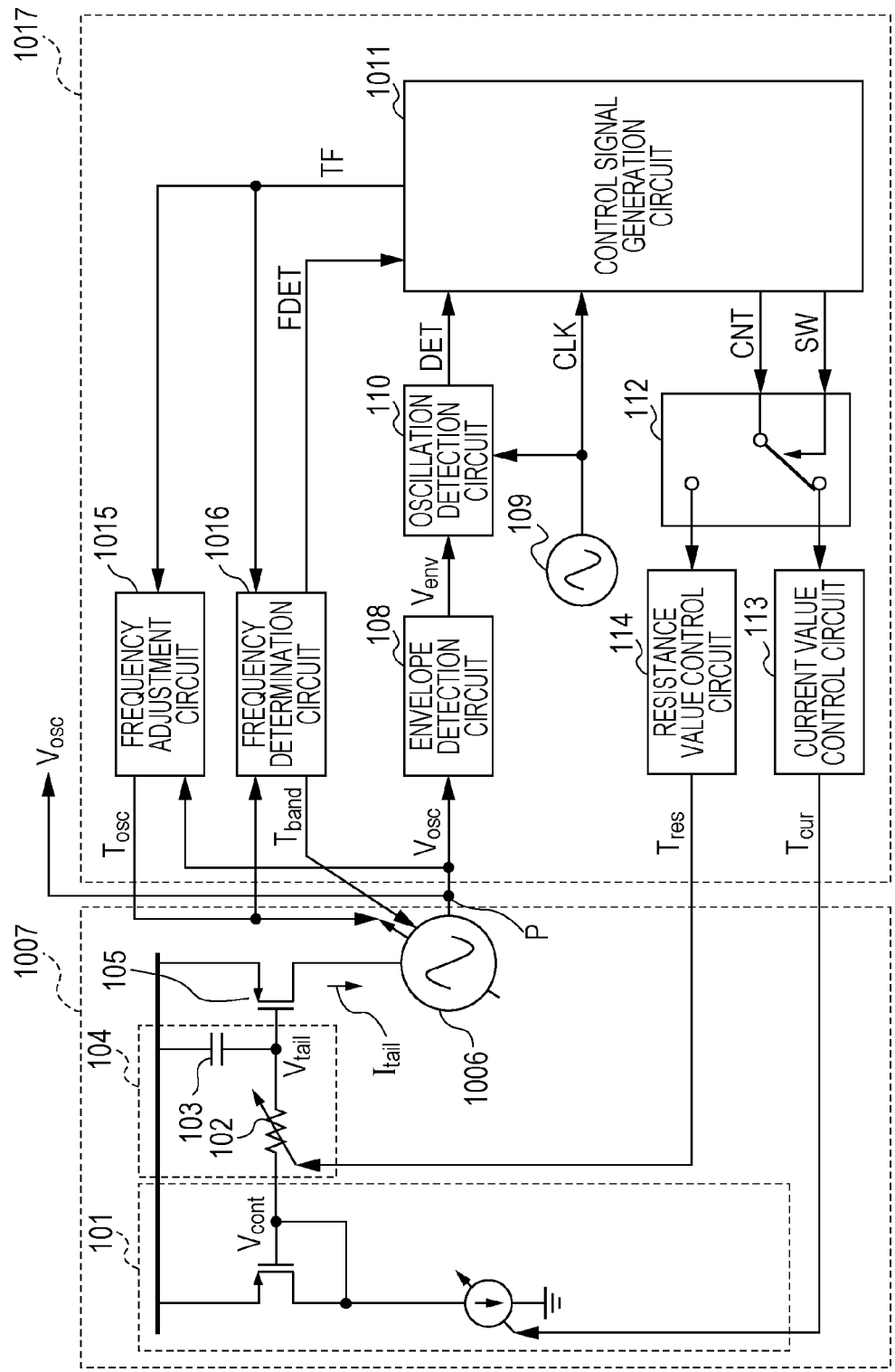
FIG. 11 is a block diagram depicting a configuration example of an oscillation signal generation circuit according to a second embodiment of the present disclosure.

FIG. 11 is a block diagram depicting a configuration example of the oscillation signal generation circuit according to this embodiment. Incidentally, in FIG. 11, such component elements as are found also in FIG. 2 will be identified with the same reference characters and their detailed explanations will be omitted.

A voltage controlled oscillator 1007 depicted in FIG. 11 has a configuration obtained by replacing the core circuit 106 in the voltage controlled oscillator 107 depicted in FIG. 2 with a core circuit 1006. Moreover, a calibration circuit 1017 has a configuration obtained by replacing the control signal generation circuit 111 in the calibration circuit 115 depicted in FIG. 2 with a control signal generation circuit 1011 and adding a frequency adjustment circuit 1015 and a frequency determination circuit 1016.

The control signal generation circuit 1011 has, in addition to the configuration of the control signal generation circuit 111 described in FIG. 2, a configuration by which the control signal generation circuit 1011 outputs a control signal TF to the frequency adjustment circuit 1015 and the frequency determination circuit 1016. The control signal TF is a signal that makes the frequency adjustment circuit 1015 and the frequency determination circuit 1016 start control of the range of an oscillation frequency. The control signal generation circuit 1011 detects the oscillation continuance condition and then outputs the control signal TF to the frequency adjustment circuit 1015 and the frequency determination circuit 1016.

The frequency adjustment circuit 1015 receives the output signal $V_{osc}$ which is output from the core circuit 1006, tunes, for example, the frequency division ratio of a frequency divider provided in the frequency adjustment circuit 1015 or a reference frequency source in accordance with a predetermined order, and outputs the control signal $T_{osc}$ to the core circuit 1006 and the frequency determination circuit 1016.

The frequency determination circuit 1016 receives the control signal $T_{osc}$ and determines whether or not the output signal $V_{osc}$ falls within the oscillation frequency range based on whether or not the control signal $T_{osc}$ is a fixed value. If the control signal $T_{osc}$ is a fixed value, this indicates that the oscillation frequency is stabilized. The frequency determination circuit 1016 determines that the output signal $V_{osc}$ falls within the oscillation frequency range if the control signal $T_{osc}$ is a fixed value at all the oscillation frequencies in a desired oscillation frequency range. On the other hand, if the frequency determination circuit 1016 determines that the output signal $V_{osc}$ does not fall within the oscillation frequency range, the frequency determination circuit 1016 outputs a frequency band switching control signal $T_{band}$ to the core circuit 1006.

The core circuit 1006 has a variable capacitance whose capacitance value is variable and changes the capacitance value in accordance with the frequency band switching control signal $T_{band}$. The oscillation signal generation circuit depicted in FIG. 11 can change the oscillation frequency by changing the capacitance value of the variable capacitance of the core circuit 1006.

With the configuration described above, the oscillation signal generation circuit according to this embodiment can change the oscillation frequency of the output signal $V_{osc}$, after the output signal $V_{osc}$ oscillates, in such a way that the output signal $V_{osc}$ oscillates in a desired oscillation frequency range. The capacitance value controlled such that the output signal $V_{osc}$ oscillates in a desired oscillation frequency range is referred to as an oscillation frequency condition.

Incidentally, while control of the range of the oscillation frequency is being performed, the state sometimes enters a state in which the oscillation continuance condition is not met (that is, the oscillation of the output signal $V_{osc}$ sometimes stops). In this case, it is necessary to perform control to make the output signal $V_{osc}$ oscillate.

For example, based on the control signal $T_{osc}$ and the control signal TF, the frequency determination circuit 1016 outputs, to the control signal generation circuit 1011, a control signal FDET indicating the state of control performed by the calibration circuit 1017.

Specifically, first, in an initial state (that is, a state in which a control loop (an oscillation control loop) for starting oscillation is performed), the frequency determination circuit 1016 outputs, to the control signal generation circuit 1011, the control signal FDET indicating that the oscillation control loop is executed.

If the frequency determination circuit 1016 receives the control signal TF, the frequency determination circuit 1016 determines whether or not the output signal $V_{osc}$ falls within the oscillation frequency range. If the output signal $V_{osc}$ does not fall within the oscillation frequency range, the frequency determination circuit 1016 outputs, to the control signal generation circuit 1011, the control signal FDET indicating that the frequency range control loop is being executed.

If the frequency determination circuit 1016 confirms that the oscillation of the output signal $V_{osc}$ has stopped, the frequency determination circuit 1016 outputs, to the control signal generation circuit 1011, the control signal FDET indicating that the loop returns to the oscillation control loop from the frequency range control loop.

If the control signal generation circuit 1011 receives the control signal FDET indicating a return to the oscillation control loop, the control signal generation circuit 1011 returns to the control loop (the oscillation control loop) for starting oscillation and controls the current value or the resistance value. Then, after detecting the oscillation continuance condition again, the control signal generation circuit 1011 outputs the control signal TF to the frequency adjustment circuit 1015 and the frequency determination circuit 1016, and the frequency range control loop is started again. Then, if the frequency determination circuit 1016 determines that the output signal $V_{osc}$ is oscillating in a desired oscillation frequency range, the frequency determination circuit 1016 outputs the control signal FDET indicating the completion of control to the control signal generation circuit 1011.

As described above, with the configuration of the oscillation signal generation circuit described in this embodiment, by repeating the frequency range control loop and the oscillation control loop, it is possible to suppress phase noise while making the output signal fall within a desired frequency range (that is, meeting the oscillation frequency condition) and meeting the oscillation condition (the oscillation continuance condition).

Incidentally, the oscillation signal generation circuit described in this embodiment may have a storage, such as a memory or a register, which stores the oscillation starting condition, the oscillation continuance condition, and the oscillation frequency condition.

Incidentally, the calibration circuit in each embodiment may be configured so as to be implemented in a semiconductor integrated circuit such as LSI together with the voltage controlled oscillator. Moreover, the calibration circuit in each embodiment may be configured so as to be implemented in a semiconductor integrated circuit such as LSI which is different from the semiconductor integrated circuit in which the voltage controlled oscillator is implemented.

In the embodiments described above, the calibration circuit is integrated with the voltage controlled oscillator, but the calibration circuit may perform calibration of the voltage controlled oscillator alone. For example, the current value and the resistance value which are oscillation conditions may be determined by connecting the produced voltage controlled oscillator to the calibration circuit. With this configuration, it is possible to suppress a reduction in the yield of the produced voltage controlled oscillator.

It would be appreciated by a person skilled in the art that numerous variations and/or modifications may be made to the present disclosure as shown in the specific embodiments without departing from the spirit or scope of the present disclosure as broadly described. The present embodiments are, therefore, to be considered in all respects to be illustrative and not restrictive. It should be further noted that the individual features of the different embodiments of the present disclosure may individually or in arbitrary combination be subject matter to another present disclosure.

Further, although the various embodiments of the present disclosure have been explained to be configured using hardware, they may also be implemented by a combination of software modules and a hardware implementation. The software modules may be stored on any kind of computer readable storage media, for example RAM, EPROM, EEPROM, flash memory, registers, hard disks, CD-ROM, DVD, etc.

The blocks used for the description of the embodiments are typically realized as an LSI comprising at least one input terminal and an at least one output terminal, which is an integrated circuit. These may be individually chipped or part or all of the functional blocks may be collectively chipped. Here, the term "LSI" is used, but terms "IC", "system LSI", "super LSI", and "ultra LSI" may be used depending on the degree of integration.

Furthermore, a method for realizing the integrated circuit is not limited to LSI, but the integrated circuit may be realized by a dedicated circuit or a general processor. An FPGA (Field Programmable Gate Array) that can be programmed after production of an LSI or a reconfigurable processor in which connection and settings of a circuit cell in the LSI can be reconfigured may be used.

Furthermore, if other techniques for achieving an integrated circuit that take the place of LSI appear as a result of the progress or derivation of the semiconductor technique, it is of course possible to realize integration of functional blocks by using such other techniques. One possibility is application of a biotechnology etc.

The oscillation signal generation circuit according to the present disclosure is suitably used in radar devices and communication devices that operate in a high frequency band exceeding 100 GHz.

What is claimed is:

1. An oscillation signal generation circuit, comprising:
   an oscillator including
      a reference signal source circuit that has a reference signal source outputting a reference signal and which, in operation, converts the output reference signal into a control voltage,
      a first filter that includes a variable resistance and a variable capacitance and which, in operation, removes noise in the control voltage,
      a first transistor which, in operation, converts the control voltage output from the first filter into a control current and outputs the control current,
      a core circuit which, in operation, is driven by the control current and generates an output signal, and
      an output terminal which, in operation, outputs the generated output signal; and
   a calibration circuit connected to the output terminal of the oscillator, which, in operation, detects whether or not the generated output signal is oscillating, and adjusts a current value of the control current by controlling a resistance value of the variable resistance in accordance with the detection result.

2. The oscillation signal generation circuit according to claim 1,
   wherein the calibration circuit adjusts the current value of the control current to any one of a plurality of current values by controlling the resistance value of the variable resistance until the calibration circuit detects oscillation of the output signal.

3. The oscillation signal generation circuit according to claim 1,
   wherein the calibration circuit adjusts the current value of the control current by changing an output value of the reference signal stepwise from a lower limit value to an upper limit value of a first range until the calibration circuit detects oscillation of the output signal, and
   if the calibration circuit does not detect the oscillation of the output signal even when the calibration circuit changes the output value of the reference signal to the upper limit value of the first range, the calibration circuit changes the resistance value of the variable resistance stepwise from an upper limit value to a lower limit value of a second range until the calibration circuit detects the oscillation of the output signal.

4. The oscillation signal generation circuit according to claim 3,
wherein the calibration circuit further includes a storage that stores the output value of the reference signal and the resistance value of the variable resistance as an oscillation starting condition if the calibration circuit detects the oscillation of the output signal.

5. The oscillation signal generation circuit according to claim 4,
wherein if the calibration circuit detects the oscillation of the output signal by controlling the output value of the reference signal, the calibration circuit stores in the storage a minimum value, among output values of the reference signal at which the oscillation of the output signal is detected, as an oscillation continuance condition, and
if the calibration circuit detects the oscillation of the output signal by controlling the resistance value of the variable resistance, the calibration circuit stores in the storage a maximum value, among resistance values of the variable resistance at which the oscillation of the output signal is detected, as the oscillation continuance condition.

6. The oscillation signal generation circuit according to claim 3,
wherein the calibration circuit includes
an envelope detection circuit which, in operation, outputs an envelope amplitude of the output signal;
an oscillation detection circuit which, in operation, detects, based on the envelope amplitude, whether or not the output signal is oscillating and outputs a detection signal indicating the detection results;
a control signal generation circuit which, in operation, outputs, based on the detection signal, a first control signal indicating a value of the control current and a second control signal indicating an output destination of the first control signal;
a resistance value control circuit which, in operation, controls the resistance value of the variable resistance in accordance with the value of the control current indicated by the first control signal;
a reference signal value control circuit which, in operation, controls the output value of the reference signal in accordance with the value of the control current indicated by the first control signal; and
a first switch which, in operation, switches the output destination of the first control signal to either the resistance value control circuit or the reference signal value control circuit in accordance with the second control signal.

7. The oscillation signal generation circuit according to claim 6,
wherein the control signal generation circuit includes
a counter circuit which, in operation, increments a number in a counter if the detection signal indicates that the oscillation of the output signal is not detected; and
a comparator which, in operation, compares the number in the counter with a threshold value, and
wherein the counter circuit outputs the first control signal, the first control signal indicating the number in the counter instead of the value of the control current, and the comparator outputs, if the number in the counter is greater than the threshold value, the second control signal indicating a change of the output destination of the first control signal.

8. The oscillation signal generation circuit according to claim 6,
wherein the control signal generation circuit includes
a counter circuit which, in operation, increments a number in a counter if the detection signal indicates that the oscillation of the output signal is not detected and decrements the number in the counter if the detection signal indicates that the oscillation of the output signal is detected; and
a comparator which, in operation, determines that the number in the counter falls within a third range,
wherein the counter circuit outputs the first control signal, the first control signal indicating the number in the counter instead of the value of the control current, and
the comparator outputs, if the number in the counter is out of the third range, the second control signal indicating a change of the output destination of the first control signal.

9. The oscillation signal generation circuit according to claim 6,
wherein the variable resistance comprises a plurality of element resistances connected in series and a plurality of second switches, each of the plurality of second switches being connected in parallel to corresponding one of the plurality of element resistances, and
the resistance value control circuit outputs, to each of the plurality of second switches, a switching signal for switching ON/OFF of each of the plurality of second switches based on the first control signal.

10. The oscillation signal generation circuit according to claim 6,
wherein the variable resistance comprises a second transistor whose resistance value varies in accordance with a resistance value control voltage which is input to a gate terminal of the second transistor, and
the resistance value control circuit outputs, based on the first control signal, a control signal to the second transistor, the control signals indicating a magnitude of the resistance value control voltage.

11. The oscillation signal generation circuit according to claim 10, wherein the reference signal source includes
a reference current source which, in operation, includes a third transistor which outputs a reference current whose current value varies in accordance with a current value control voltage which is input to a gate terminal of the third transistor; and
a fourth transistor which, in operation, converts the reference current into a voltage and outputs the voltage obtained by conversion as the control voltage, and
wherein the reference signal value control circuit outputs, to the reference signal source, a control signal indicating a magnitude of the current value control voltage based on the first control signal.

12. The oscillation signal generation circuit according to claim 11,
wherein the reference signal source includes a reference current source and a fifth transistor,
wherein the reference current source includes a plurality of sixth transistors that are provided in parallel with each other, each of the plurality of sixth transistors outputs a current having a predetermined value, and a plurality of third switches which respectively switch connection of each of the plurality of sixth transistors, the reference current source outputs, as a reference current, a current from at least one or more sixth transistors connected by the plurality of third switches, the fifth transistor converts the reference current into a voltage and outputs the voltage obtained by conversion as the control voltage, and the reference signal value control circuit controls a value of the reference current by using a switching signal for switching ON/OFF of the plurality of third switches based on the first control signal.

13. The oscillation signal generation circuit according to claim 6, wherein the oscillator outputs differential output signals including a positive phase signal and a reversed phase signal, the envelope detection circuit includes
- a squaring circuit which, in operation, generates a positive output by squaring either the positive phase signal or the reversed phase signal and generates a negative output by multiplying the positive phase signal and the reversed phase signal; and
- a second filter which, in operation, allows direct-current components of the positive output and the negative output to pass therethrough, and wherein the oscillation detection circuit outputs, if the direct-current component of the positive output differs from the direct-current component of the negative output, the detection signal indicating that the differential output signals are oscillating.

14. The oscillation signal generation circuit according to claim 13, wherein the oscillator outputs a single-phase output signal, wherein the envelope detection circuit includes
- a squaring circuit which, in operation, squares the single-phase output signal, and
- a third filter which, in operation, allows a direct-current component of the single-phase output signal squared to pass therethrough, and the oscillation detection circuit compares the direct-current component of the single-phase output signal that has passed through the third filter with a predetermined determination value and, if the direct-current component of the single-phase output signal is greater than the predetermined determination value, the oscillation detection circuit outputs the detection signal indicating that the single-phase output signal is oscillating.

15. The oscillation signal generation circuit according to claim 1, wherein the capacitance is a fixed capacitance.

16. The oscillation signal generation circuit according to claim 1, wherein the core circuit has a variable capacitance whose capacitance value is variable, the calibration circuit further includes
- a frequency adjustment circuit which, in operation, outputs a control signal for adjusting an oscillation frequency of the output signal; and
- a frequency determination circuit which, in operation, determines whether or not the oscillation frequency of the output signal is a desired frequency, and the frequency determination circuit changes the capacitance value of the variable capacitance if the frequency determination circuit determines that the oscillation frequency is not a desired frequency.

\* \* \* \* \*